US007586755B2

(12) United States Patent
Satoh et al.

(10) Patent No.: US 7,586,755 B2
(45) Date of Patent: Sep. 8, 2009

(54) ELECTRONIC CIRCUIT COMPONENT

(75) Inventors: Toshiya Satoh, Kanasago (JP); Masahiko Ogino, Hitachi (JP); Takao Miwa, Hitachinaka (JP); Takashi Naitou, Mito (JP); Takashi Namekawa, Hitachi (JP); Toshihide Nabatame, Tsukuba (JP); Shigehisa Motowaki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 217 days.

(21) Appl. No.: 11/834,452

(22) Filed: Aug. 6, 2007

(65) Prior Publication Data

US 2008/0174976 A1    Jul. 24, 2008

Related U.S. Application Data

(62) Division of application No. 10/483,326, filed as application No. PCT/JP02/07092 on Jul. 12, 2002, now abandoned.

(30) Foreign Application Priority Data

Jul. 12, 2001   (JP)   ............... 2001-211539
Jul. 12, 2001   (JP)   ............... 2001-211540

(51) Int. Cl.
*H05K 7/00* (2006.01)

(52) U.S. Cl. ................ 361/782; 361/761; 361/738; 361/763; 361/765; 361/766; 361/762; 361/760; 174/262

(58) Field of Classification Search ........... 361/738, 361/763, 765, 766, 760, 782, 762, 761, 278, 361/793–795, 299.1, 299.2, 299.3, 299.5, 361/298.2, 298.3, 298.4, 301.1, 306.3, 307, 361/308.1; 174/258, 251, 260–266, 549, 174/551

See application file for complete search history.

(56) References Cited

U.S. PATENT DOCUMENTS 4,490,429 A    12/1984   Tosaki et al.

(Continued)

FOREIGN PATENT DOCUMENTS

EP    0 675 539 A2   10/1995
EP    1 085 572 A2    3/2001

(Continued)

OTHER PUBLICATIONS

European Search Report dated Aug. 6, 2008 (Four (4) pages).
S.K. Bhattacharya et al., Integral passives for next generation of electronic packaging: application of epoxy/ceramic nanocomposites as integral capacitors, Microelectronics Journal, Mackintosh Publications LTD. vol. 32, No. 1, Jan. 1, 2001, pp. 11-19.

*Primary Examiner*—Tuan T Dinh
*Assistant Examiner*—Hoa C Nguyen
(74) *Attorney, Agent, or Firm*—Crowell & Moring LLP

(57) ABSTRACT

Through an improvement of module size increase due to mounting a single passive element on a substrate and an increase in the mounting cost, to provide a highly reliable, high performance and small sized electronic circuit component which permits to integrate a variety of electronic parts such as capacitors, inductors and resistors in a high density with low cost.

The electronic circuit component comprises an insulator substrate, a plurality of electrodes having different areas provided on the insulator substrate, one or more elements selected from a capacitor element of dielectric material sandwiched between the electrodes, an inductor element and resistor element, a metal wiring connecting the elements, a metal terminal part of a part of the metal wiring and an organic insulator material covering the elements and the circumference of the metal wiring portion excluding the metal terminal portion.

7 Claims, 15 Drawing Sheets

U.S. PATENT DOCUMENTS

| | | | |
|---|---|---|---|
| 4,835,038 A | | 5/1989 | Kaneko et al. |
| 5,920,454 A | * | 7/1999 | Nomura et al. ............ 361/313 |
| 5,928,766 A | | 7/1999 | Hanamura |
| 6,021,050 A | * | 2/2000 | Ehman et al. ............... 361/793 |
| 6,153,926 A | * | 11/2000 | Kawamoto ................. 257/676 |
| 6,185,105 B1 | * | 2/2001 | Inoguchi ..................... 361/760 |
| 6,356,455 B1 | * | 3/2002 | Carpenter ................... 361/793 |
| 6,407,929 B1 | * | 6/2002 | Hale et al. .................. 361/763 |
| 6,476,695 B1 | | 11/2002 | Nakamichi |
| 6,528,732 B1 | * | 3/2003 | Okubora et al. ............. 174/255 |
| 6,529,385 B1 | * | 3/2003 | Brady et al. ................ 361/766 |
| 6,535,398 B1 | * | 3/2003 | Moresco ..................... 361/792 |
| 6,556,453 B2 | * | 4/2003 | Figueroa et al. ............ 361/306.3 |
| 6,611,419 B1 | * | 8/2003 | Chakravorty ............ 361/306.3 |
| 6,636,416 B2 | * | 10/2003 | Li et al. ..................... 361/306.1 |
| 6,734,534 B1 | | 5/2004 | Vu et al. |
| 6,933,601 B2 | | 8/2005 | Satoh et al. |
| 6,970,362 B1 | * | 11/2005 | Chakravorty ............... 361/782 |
| 7,342,803 B2 | * | 3/2008 | Inagaki et al. .............. 361/763 |
| 2001/0008479 A1 | * | 7/2001 | Branchevsky ........... 361/306.3 |
| 2002/0027773 A1 | * | 3/2002 | Davidson ................... 361/763 |
| 2002/0117743 A1 | | 8/2002 | Nakatani et al. |
| 2002/0145180 A1 | * | 10/2002 | Terui et al. .................. 257/666 |
| 2004/0150966 A1 | | 8/2004 | Hu |

FOREIGN PATENT DOCUMENTS

| | | |
|---|---|---|
| JP | 63-13397 A | 1/1988 |
| JP | 04-026184 | 1/1992 |
| JP | 5-218042 A | 8/1993 |
| JP | 06-125180 | 5/1994 |
| JP | 06-181119 | 6/1994 |
| JP | 07-106133 | 4/1995 |
| JP | 07-106134 | 4/1995 |
| JP | 08-255981 | 10/1996 |
| JP | 09-321184 | 12/1997 |
| JP | 10-041632 | 2/1998 |
| JP | 10-79452 A | 3/1998 |
| JP | 10-284694 | 10/1998 |
| JP | 2000-124358 | 4/2000 |
| JP | 2000-28611 | 10/2000 |
| JP | 2001-044075 | 2/2001 |
| WO | WO 00/54337 A1 | 9/2000 |

* cited by examiner

ELECTRONIC CIRCUIT COMPONENT

CROSS-REFERENCE TO RELATED APPLICATIONS

This application is a divisional of U.S. application Ser. No. 10/483,326 filed Jul. 13, 2004 (PCT/JP02/07092, filed Jul. 12, 2002) and claims priority of Japanese patent application no. 2001-211540 filed Jul. 12, 2001, the disclosure of which is incorporated by reference herein.

FIELD OF THE INVENTION

The present invention relates to an electronic part and the manufacturing method thereof, in particular, relates to a technology which is effective when being applied to an electronic part using glass for the substrate and a manufacturing method therefore.

BACKGROUND ART

JP-A-8-255981 discloses a technology in which, by using an exposing process for a photo sensitive material with ultraviolet light, microscopic via holes and wirings are formed on a glass substrate. In the document, through forming a light shielding film of a metal constituting of such as Ti, Cr, Al, Ni, W, Mo, Ta and Cu on the glass substrate, multiple reflection of ultraviolet between the upper and lower faces of the glass substrate is prevented at the time of the exposing process of the photo sensitive material. Further, through forming the film thickness of the light shielding film constituted by one of the above metals more than 3 μm, the heat conductivity of the glass substrate is enhanced.

JP-A-9-321184 discloses a connection substrate for connecting a semiconductor chip having a high wiring density with a printed wire substrate having a low wiring density and manufacturing method thereof. The connection substrate is constituted by a photosensitive glass substrate and on the upper face thereof one layer wiring is formed to which a bump for the chip is connected. Further, on the lower face of the substrate a plurality of bumps are formed, which are connected to electrodes on the printed wire substrate. The wirings on the upper face of the substrate and the bump on the lower face are electrically connected through holes penetrating between the upper and lower faces of the substrate. These penetrating holes are formed through a photolithography and the insides thereof conductors are buried through plating.

JP-A-2000-124358 discloses a technology of a high frequency integrated circuit mounting an active element in which an MIM type capacitor, a spiral inductor, a thin film resistor and metal wirings for connecting these are arranged on a silicon substrate and further, a flip chip is mounted thereon. Further, the claims thereof cover the use of a glass substrate, although the details thereof and the advantages thereof are not disclosed.

JP-A-10-284694 discloses a technology of constituting an electronic circuit on a poly crystal silicon substrate having a resistivity of more than 200 Ωcm.

As the wiring substrate for mounting an electronic parts, one in which Cu wirings are formed on a resin substrate constituted such as epoxy resin containing glass fibers (glass epoxy) and polyimide resin or one in which W wirings are formed on a ceramics substrate such as AlN and SiC are broadly used.

However the warp and size variation of the wiring materials such as the resin and the ceramics are large in comparison with those of silicon substrate which is used in the manufacture of the semiconductor integrated circuits and the formation of microscopic wirings and through holes of the order of μm by using a photolithography is impossible, therefore, it was difficult to mount the electronic parts in high density.

On the other hand, as the wiring substrate for mounting electronics parts, the general use property of the silicon substrate, which is suitable for forming the microscopic wirings is low in comparison with such as the glass epoxy substrate, and it's usage is limited. Further, since the single crystal silicon substrate is a semiconductor, the substrate operates to reduce the efficiency of the electronic parts such as a capacitor and inductor formed thereon. On the other hand, the poly crystal silicon substrate can prevent in some extent the efficiency reduction, however, the poly crystal silicon substrate is more expensive than the single crystal silicon and the general use property thereof as the wiring substrate for mounting electronic parts is low and the usage thereof is limited.

Since the glass shows characteristics that the warp and the size variation are small in comparison with such as the resin and ceramics and the cost thereof is inexpensive in comparison with the silicon, it is considered that glass is a suitable substrate material for mounting electronic parts in high density. Further, the glass substrate is a desirable insulator, therefore the elements such as the inductors formed thereon show a high efficiency.

However, since the heat conductivity of the ordinal glass substrate as disclosed on JP-A-2000-124358 is low and is likely broken, such as cracks and damages are frequently caused due to difference of the thermal expansion coefficients between the glass substrate and other materials (Si), as a result, yield thereof reduces and the reliability thereof also reduces.

Further, in order to mount electronic parts on the glass substrate in high density as well as to use the glass substrate in a broad usage, it is necessary to lead out electrodes to be used as external connection terminals from the back face of the substrate (opposite side face from the mounting face of the electronic parts) as being practiced in the wiring substrate of such as resin and ceramics.

In order to lead out the external connection terminals from the back face of the substrate, it is necessary to form through holes in the glass substrate in high accuracy, however, if a special photosensitive glass as, for example, disclosed in JP-A-9-321184 is used, the manufacturing cost of the substrate increases and it's usage is limited as the substrate for mounting the electronic parts.

Further, as disclosed in JP-A-2000-124358 when all of the variety of the electronic parts such as the capacitor, inductor and resistor are arranged on the substrate, the size of the integrated electronic parts become comparatively large.

Further, in the above document, since the respective constituting elements formed on the glass substrate are structured to be exposed at the end face of the substrate, when a large mechanical stress is applied at the interface regions of the respective layers constituting the electronic circuit component at the time of cutting out such as by dicing from the glass substrate larger than the electronic part, and when a large thermal stress is applied at the interfaces of the respective layers in connection with sudden temperature variation caused at the time of mounting the electronic circuit component, these stresses are concentratedly applied on the substrate exposed at the end faces of the electronic circuit component and the interface regions of the respective layers, thereby, the interface regions of the respective layers may be peeled off and the electronic circuit component may be damaged.

Accordingly, these already known electronic circuit components do not necessarily show a high reliability, in addition, it was not necessarily easy to obtain a high manufacturing yield.

An object of the present invention is to provide an electronic circuit component, which integrates a variety of electronic parts such as a capacitor, inductor and resistor in a high performance and in a high density.

DISCLOSURE OF THE INVENTION

In order to achieve the above object, an electronic circuit component comprises an insulator substrate, a plurality of electrodes having different areas provided on the insulator substrate, one or more elements selected from a capacitor element of dielectric material sandwiched between the electrodes, an inductor element and resistor element, a metal wiring connecting the elements, a metal terminal part of a part of the metal wiring and an organic insulator material covering the elements and the circumference of the metal wiring portion excluding the metal terminal portion, with the above provision an electronic circuit component, which shows a desirable manufacturing yield and permits to integrate in a high density a variety of electronic parts such as the capacitor, inductor and resistor can be obtained.

Further, in order to achieve the above object, an electronic circuit component comprises an insulator substrate, a plurality of electrodes provided on the insulator substrate, one or more elements selected from a capacitor element of dielectric material sandwiched between the electrodes, an inductor element and resistor element, a connecting portion provide at portions other than end portions of the electrodes, a metal wiring connecting the elements and the connecting portion, a metal terminal part of a part of the metal wiring and an organic insulator material covering the elements and the circumference of the metal wiring portion excluding the metal terminal portion, with the above provision a n electronic circuit component, which shows a desirable manufacturing yield and permits to integrate in a high density a variety of electronic parts such as the capacitor, inductor and resistor can be obtained.

Further, in order to achieve the above object, an electronic circuit component comprises an insulator substrate, a plurality of electrodes provided on the insulator substrate, one or more elements selected from a capacitor element of dielectric material sandwiched between the electrodes, an inductor element and resistor element, a metal wiring connecting the elements, a metal terminal part of a part of the metal wiring and being arranged in a grid shape and an organic insulator material covering the elements and the circumference of the metal wiring portion excluding the metal terminal portion, with the above provision an electronic circuit component, which shows a desirable manufacturing yield and permits to integrate in a high density a variety of electronic parts such as the capacitor, inductor and resistor can be obtained and to ease connection with other parts such as a connection substrate.

Further, in order to achieve the above object, an electronic circuit component comprises an insulator substrate, a plurality of electrodes provided on the insulator substrate, one or more elements selected from a capacitor element of dielectric material sandwiched between the electrodes, an inductor element and resistor element, a metal wiring connecting the elements, a metal terminal part of a part of the metal wiring and a plurality of organic insulator materials covering the elements and the circumference of the metal wiring portion excluding the metal terminal portion, with the above provision an electronic circuit component, which shows a desirable manufacturing yield and permits to integrate in a high density and in a high performance a variety of electronic parts such as the capacitor, inductor and resistor through selection of the organic insulator materials suitable for the necessary high frequency characteristics of the respective elements can be obtained.

In order to achieve the above object, an electronic circuit component comprises an insulator substrate at predetermined position of which through holes are provided, a plurality of electrodes having different areas provided on both faces of the main face and the sub-main face or one of the faces of the insulator substrate, one or more elements selected from a capacitor element of dielectric material sandwiched between the electrodes, an inductor element and resistor element, a metal wiring connecting the elements, a conductor portions formed inside the through holes for electrically connecting the metal wiring, a metal terminal part of a part of the metal wiring and an organic insulator material covering the elements and the circumference of the metal wiring portion excluding the metal terminal portion, with the above provision an electronic circuit component, which shows a desirable manufacturing yield and permits to integrate in a high density a variety of electronic parts such as the capacitor, inductor and resistor can be obtained.

In order to achieve the above object, an electronic circuit component comprises an insulator substrate at predetermined position of which through holes are provided, a plurality of electrodes having different areas provided on both faces of the main face and the sub-main face or one of the faces of the insulator substrate, one or more elements selected from a capacitor element of dielectric material sandwiched between the electrodes, an inductor element and resistor element, connecting portions provided at portions other than end portions of the electrodes, a metal wiring connecting the elements and the connecting portions, a conductor portions formed inside the through holes for electrically connecting the metal wiring, a metal terminal part of a part of the metal wiring and an organic insulator material covering the elements and the circumference of the metal wiring portion excluding the metal terminal portion, with the above provision an electronic circuit component, which shows a desirable manufacturing yield and permits to integrate in a high density a variety of electronic parts such as the capacitor, inductor and resistor can be obtained.

In order to achieve the above object, an electronic circuit component comprises an insulator substrate at predetermined position of which through holes are provided, a plurality of electrodes having different areas provided on both faces of the main face and the sub-main face or one of the faces of the insulator substrate, one or more elements selected from a capacitor element of dielectric material sandwiched between the electrodes, an inductor element and resistor element, a metal wiring connecting the elements, a conductor portions formed inside the through holes for electrically connecting the metal wiring, a metal terminal part of a part of the metal wiring and being arranged in a grid shape and an organic insulator material covering the elements and the circumference of the metal wiring portion excluding the metal terminal portion, with the above provision an electronic circuit component, which shows a desirable manufacturing yield and permits to integrate in a high density a variety of electronic parts such as the capacitor, inductor and resistor and to ease connection with other parts such as a connection substrate can be obtained.

Further, in order to achieve the above object, an electronic circuit component comprises an insulator substrate at predetermined position of which through holes are provided, a plurality of electrodes provided on both faces of the main face and the sub-main face or one of the faces of the insulator substrate, one or more elements selected from a capacitor element of dielectric material sandwiched between the electrodes, an inductor element and resistor element, a metal wiring connecting the elements, a conductor portions formed inside the through holes for electrically connecting the metal wiring, a metal terminal part of a part of the metal wiring and a plurality of organic insulator materials covering the elements and the circumference of the metal wiring portion excluding the metal terminal portion, with the above provision an electronic circuit component, which shows a desirable manufacturing yield and permits to integrate in a high density and in a high performance a variety of electronic parts such as the capacitor, inductor and resistor through selection of the organic insulator materials suitable for the necessary frequency characteristics of the respective elements can be obtained.

Further, in order to achieve the above object, an electronic circuit component comprises an insulator substrate at predetermined position of which through holes are provided, a plurality of electrodes provided on both faces of the main face and the sub-main face or one of the faces of the insulator substrate, one or more elements selected from a capacitor element of dielectric material sandwiched between the electrodes, an inductor element and resistor element, a metal wiring connecting the elements, a conductor portions formed inside the through holes for electrically connecting the metal wiring, a metal terminal part of a part of the metal wiring, a first organic insulator material covering the elements provided on the main face of the insulator substrate and the circumference of the metal wiring portion excluding the metal terminal portion and a second organic insulator material covering the elements provided on the sub-main of the insulator substrate and the circumference of the metal wiring portion excluding the metal terminal portion, with the above provision an electronic circuit component, which shows a desirable manufacturing yield and permits to integrate in a high density and in a high performance a variety of electronic parts such as the capacitor, inductor and resistor through selection of the organic insulator materials suitable for the necessary frequency characteristics of the respective elements can be obtained.

Further, in order to achieve the above object, an electronic circuit component comprises an insulator substrate at predetermined position of which through holes are provided, a plurality of electrodes provided on both faces of the main face and the sub-main face or one of the faces of the insulator substrate, one or more elements selected from a capacitor element of dielectric material sandwiched between the electrodes, an inductor element and resistor element, a metal wiring connecting the elements, a conductor portions formed inside the through holes for electrically connecting the metal wiring, a metal terminal part of a part of the metal wiring and being provided on the other face where the inductor element is provided and an organic insulator material covering the elements and the circumference of the metal wiring portion excluding the metal terminal portion, with the above provision an electronic circuit component, which shows a desirable manufacturing yield, reduces an influence to the inductor element from electronic parts mounted on the substrate and permits to integrate in a high density and in a high performance a variety of electronic parts such as the capacitor, inductor and resistor can be obtained.

Further, in order to achieve the above object, an electronic circuit component comprises an insulator substrate at predetermined position of which through holes are provided, a plurality of electrodes provided on both faces of the main face and the sub-main face or one of the faces of the insulator substrate, one or more elements selected from a capacitor element of dielectric material sandwiched between the electrodes, an inductor element and resistor element, a metal wiring connecting the elements, a conductor portions constituted of a conductive material, core forming material and glass and formed inside the through holes for electrically connecting the metal wiring, a metal terminal part of a part of the metal wiring and an organic insulator material covering the elements and the circumference of the metal wiring portion excluding the metal terminal portion, with the above provision an electronic circuit component, which shows a desirable manufacturing yield, ensures electrical conduction between both faces of the substrate and permits to integrate in a high density and in a high performance a variety of electronic parts such as the capacitor, inductor and resistor can be obtained.

Further, in order to achieve the above object, since distances of the electrodes, the capacitor element of a dielectric material formed being sandwiched between the electrodes, the inductor element and the resistor element with respect to the insulator substrate are differentiated, the capacitor, inductor and resistor elements can be integrated in a further high density.

Still further, in order to achieve the above object, through the use of the glass substrate for the insulator substrate, a further low cost and high performance electronic circuit component can be obtained because of the low cost property, high flatness, high insulation property and low dielectric loss tangent of the glass substrate.

Still further, in order to achieve the above object, through the use of the photosensitive organic insulation material for the organic insulator, a further low cost electronic circuit component can be obtained because the number of the process steps during the manufacture is reduced and the manufacturing cost thereof is reduced.

Still further, in order to achieve the above object, as the organic insulator since a low dielectric loss tangent resin composition is used which includes a bridging component having a plurality of styrene groups as expressed by the following general chemical formula and contains polymers having average molecular weight of more than 5000, a further high performance and high efficiency electronic circuit component can be obtained with a low cost because of the low cost property, low dielectric constant and low dielectric loss tangent of the low dielectric loss tangent resin compositions.

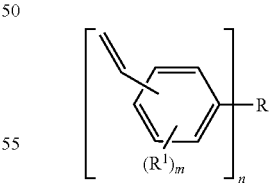

(Wherein, R represents a hydrocarbon skeleton, which may include a substituent, $R^1$ represents one of hydrogen, methyl and ethyl, m represents 1 from 4 and n represents an integer more than 1). Still further, in order to achieve the above object, when the organic insulator is polyimide resin, a highly reliable electronic circuit component can be obtained because of high thermal stability of polyimide.

Further, in order to achieve the above object, when the organic insulator is BCB (Benzo Cyclo Butene), a further high performance and high efficiency electronic circuit component can be obtained because of low dielectric constant and low dielectric loss tangent of BCB.

Further, in order to achieve the above object, when the dielectric material is an oxide of any of Ta, Mg and Sr, a low cost, high reliability and high performance electronic circuit component can be obtained because of low cost and high stability property of Ta, Mg and Sr. further, when the oxide of Ta is used for the dielectric material, the dielectric strength thereof can be enhanced, when the oxide of Mg is used, Q value can be enhanced and when the oxide of Sr is used, a high $\in$ can be obtained. Wherein Q value represents a sharpness of resonance (frequency selectivity) and is defined according to the following equation;

$$Q=\omega(\text{accumulated energy})/(\text{loss})=Im(Z)/Re(Z)$$

Wherein, Im(Z) and Re(Z) are impedances in an imaginary part and real part one port (a terminal pair) of the respective elements.

The capacitor elements of the present invention are constituted by one or more of capacitor elements having a structure in which an inorganic dielectric material is sandwiched by two metal electrodes and one or more capacitor elements having a structure in which an organic dielectric material is sandwiched by two electrodes. Further, the end portion of the metal electrode adjacent the glass substrate of the capacitor element is preferably covered by an insulator other than the dielectric material.

The metal electrode is preferably to be a low electrical resistance conductive material. More specifically, such as gold, copper, nickel, aluminum, platinum, tungsten, molybdenum, iron, niobium, titanium, nickel/chromium alloy, iron/nickel/chromium alloy and tantalum nitride are enumerated for the material. In particular, copper is preferable because of it's low electric resistance. Further, the surface of the metal electrode is required to be flat and the unevenness of the surface is preferable to be below 1/25 of the thickness of the dielectric body. Further, when a metal having a high melting point is used for a lower electrode, a laser processing or a high temperature burning can be applied during the dielectric layer formation and a high performance (due to applicability of a high $\in$ dielectric material) and an enhancement of manufacturing yield can be realized. As methods of forming the metal electrode, other than one in which after forming the conductive material in a film having a predetermined film thickness, a resist pattern is formed and the electrode is formed by dry or wet etching, after forming the resist pattern, the electrode can be formed by electro or electro less plating. With regard to forming methods of the metal electrodes and other wirings, when a plating method is used, a resistance reduction, high efficiency and high performance can be achieved, because a thick film wiring can be realized. Further, when a spattering method is used, a minuting, size reduction and high performance can be achieved, because a formation of a minute pattern can be realized.

The inorganic material is not limited, if the material is used commonly as a capacitor use dielectric material, for example, oxides of Ta, Mg and Sr are enumerated. Specifically, other than oxides such as $Ta_2O_5$, $BsT(Ba(x)Sr(1-x)TiO(3), 0\times 1)$, $SrTiO_3$, $TiO_2$, $MnO_2$, $Y_2O_3$, $SnO_2$ and $MgTiO_3$, barium titanium oxide, compound formed by doping zirconium and tin into barium titanium oxide, $WO_3$, $SrO$, mixed barium/strontium oxide, $BaWO_4$, and $CeO_2$ are enumerated. The method of forming the dielectric layer is not limited and a spattering method, a dry method such as plasma CVD method and a wet method such as anodic oxidation method can be used. A dielectric layer formation with dry method such as spattering method and etching method enables a minute pattern, which is effective for minuting, size reduction and high performance. Further, a dielectric layer formation with wet methods such as sol-gel method and anodic oxidation method can simplify the processing steps, which is effective for reducing the cost.

Further, the organic material is not limited, if such is an organic material commonly used for semiconductor whether such is thermo setting or thermo plastic. For example, polyimide, polycarbonate, polyester, poly tetra fluoro ethylene, polystylene, polypropylene, poly vinylidene fluoride, cellulose acetate, polysulfone, polyacrylonitrile, polyamide, polyamideimide, epoxy, maleimide, phenol, isocyanate, polyolefin, polyurethane and compounds thereof can be used. Mixture formed by adding a rubber component such as acrylic rubber silicone rubber and nitrylbutadiene rubber, an organic compound filler such as polyimide filler and an inorganic filler such as silica to any of the above compounds. Further, the organic material can be formed by a photosensitive material containing any of the compounds above. When a photosensitive insulator material is used, the process of forming a resist on the insulator material can be eliminated, thereby, the manufacturing yield can be enhanced. Further, a microfabrication is enabled, which can realize size reduction.

In particular, polyimide resin is preferable because of it's excellent heat resistance and chemical resistance, and further, the polyimide provided with photosensitivity is preferable because of it's excellent workability. Further, benzo cyclo butene is preferable because of it's low dielectric loss tangent, when the capacitor of the present invention is used for a high frequency parts. Likely, resin composition having low dielectric loss tangent as expressed by the following general chemical formula which includes a bridging component having a plurality of styrene groups and further, includes polymers having weight average molecular weight of more than 5000 is also preferable, because the transmission loss can be reduced. For skeletons connecting the styrene groups of the above resin composition, hydrocarbon skeletons containing alkylene groups such as methylene and ethylene. Specifically, 1,2-bis (p-biphenyl)ethane, 1,2-bis (m-biphenyl)ethane and their equivalents, homopolymer of divinyl benzene having vinyl group at the side chains and oligomers of copolymers such as with styrene are enumerated.

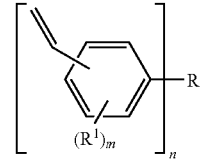

(Wherein, R represents a hydrocarbon skeleton, which may include a substituent, $R^1$ represents one of hydrogen, methyl and ethyl, m represents 1 from 4 and n represents an integer more than 1).

Further, a function as a stress buffer can be provided for the above organic insulator material. Specifically, such as fluoro rubber silicone rubber, fluoro silicone rubber, alkyle rubber, hydronitryl rubber, ethylene propylene rubber, chloro sulfonated polyethylene, epichlorhydline rubber, butyl rubber, urethane rubber, polycarbonate/alkylonitril butadiene styrene alloy, polysiloxane dimethylene terephthalate/polyethylene terephthalate copolymer polybutylene terephthalate/polycarbonate alloy, polytetrafluoroethylene, florinated ethylene propylene, polyarylate, polyamide/alkylonitril butadiene styrene alloy, denaturated epoxy, denaturated polyolefin and siloxane denaturated poly amideimide can be enumerated.

As the formation methods thereof include a pattern printing method such as a printing method, an ink jet method and an electro photography method, a method such as a film pasting method and spin coating method in which after forming organic insulation material, patterns are formed such as by photo process and laser and combination thereof.

Other than the above, a variety of thermosetting resins such as epoxy resin, unsaturated polyester resin, epoxy isocyanate resin, maleimide resin, maleimide epoxy resin, cyanic acid ester resin, cyanic acid ester epoxy resin, cyanic acid ester maleimide resin, phenol resin, diallyl phthalate resin, urethane resin, cyanamide resin and maleimide cyanamide resin, materials formed by combining two or more resins above and materials mixing inorganic filler therein can be used. Further, by providing a photosensitivity to the above resin and through a predetermined exposure and developing process the shape of the stress buffering layer can be controlled.

Further, as the organic insulators, different insulation materials can be used between layers. When different insulation materials are used between layers, a proper material depending on the required property for the particular portion such as low loss and chemical resistance can be selected, which help to achieve high performance. Further, when organic insulators are formed on both sides of the insulator substrate while sandwiching the same, if different organic materials are used, the same advantage as above can be obtained.

The inductor element of the present invention is not in particular limited, if the same is an inductive circuit element, for example, such as a spiral type formed on a plane, one formed by laminating the spiral type, and a solenoid type can be used. Further, the inductance thereof is preferable to be in a range of 10 nH/mm$^2$~100 nH/mm$^2$.

Further, the inductor element and the metal wiring can be either a same material or different material and the material therefor is selected properly according to electrical conductivity, adhesive property with the surrounding materials and formation method. Further, the formation method therefor is not in particular limited. For example, Cu film can be formed by making use of spattering method and such as Ti and Cr films can be formed at the interface thereof in view of adhesive property with the surrounding materials. Further, after forming a thin film operating as a seed film with Cu through spattering method, the inductor element can be formed by electrolytic plating. Further, as patterning methods of the wiring and the inductor element, common wire patterning methods such as etching method and lift off method can be used. Further, the wiring and the inductor element can also be formed through printing method by making use of resin paste containing metal such as Ag. Still further, when the forming temperature of the inorganic dielectric layer is high, a metal having oxidation resistant and heat resistant property such as Pt can be used. When forming the inductor, if the distance between the wirings constituting the inductor is shortened with respect to the wiring width of the inductor, the space at the center portion of the inductor can be enlarged, which enhances efficiency and performance thereof.

The resistance element of the present invention is structured by sandwiching a resistance material between two metal electrodes and the resistance material is not limited in particular, if a common resistor material is used therefor, and for example, such as CrSi and TiN can be used therefor. The formation method therefor is also not limited in particular and for example, such as spattering method and plasma CVD method can be used. Further, the resistance element is formed at the lowest layer, the burning thereof at a higher temperature than the curing temperature of the insulation material is permitted, which is effective for enhancing the manufacturing yield and the cost reduction.

The insulator substrate of the present invention is not in particular limited, if the same does not reduce the efficiency of the respective elements and shows a high insulation property. Further, the glass substrate of the present invention is also not in particular limited, if the same does not reduce the efficiency of the respective elements and shows a high insulation property and is selected in view of strength and workability thereof. Specifically, glasses containing at least one rare earth element selected among the group including Sc, Y, La, Pr, Nd, Pm, Sm, Eu, Gd, Tb, Dy, Ho, Er, Tm, Yb and Lu are in particular preferable. Further, it is preferable that the rare earth element is contained in a range of 0.5~20 weight % with respect to the entire glass components when converted based on oxide of $Ln_2O_3$ (Ln is a rare earth element) and as the other components it is preferable that $SiO_2$: 40~80 weight %, $B_2O_3$: 0~20 weight %, $R_2O$ ($R_2$ is alkali metal): 0~20 Weight %, RO (R is alkaline earth metal): 0~20 weight % and $Al_2O_3$: 0~17 weight % are contained, and it is preferable that $R_2O$+ RO are contained in an amount of 10~30 eight %, thereby, the strength of the glass substrate is greatly enhanced and the workability is significantly improved.

With regard to the configuration of the through holes of the present invention, it is preferable to satisfy the following relationship between the two opening diameters R1 and R2 of the through holes and the thickness t of the glass substrate;

$$70 \leq \tan^{-1}(t/(R1-R2)) \leq 80$$

wherein, the opening diameters R1 and R2, the arrangement thereof and the thickness of the substrate can be properly selected depending on the sizes of the elements and wirings to be mounted or integrated.

Further, the forming method thereof is not limited, if the same does not cause any large physical or chemical damage on the glass substrate. Any already known boring technology can be applied. For example, micro sand blasting method, chemical etching method, laser processing method and photosensitive processing method using photosensitive glass are enumerated. Regardless to the method used, it is important that the method used does not cause any physical or chemical damages such as chippings and cracks at the opening portions and the inside of the through holes as referred to the above.

Further, even if physical or chemical damages such as chippings and cracks are caused with any of the above through hole forming methods, such can be recovered and the substrate can be used. For the recovering, such as a method of removing the damages by etching with hydrofluoric acid of the glass surface where the chippings or cracks are caused, a method of burying such as cracks with sol-gel liquid of the glass and a method of performing a heat treatment near at the softening point of the glass substrate material are enumerated. Of course, the methods are not limited to the above, if the method can remove or seal the damages.

Further, the conductive portions of the present invention formed inside the through holes provided at the insulator substrate is not in particular limited, if such can electrically connect the metal wirings and the elements provided on the main and sub-main faces of the substrate, for example, a conductive material constituted of a conductive material, core forming material and glass can be used. Further, such is not in particular limited, if the same can electrically connect the circuit portions on both sides of the glass substrate and is properly selected according to the electrical conductivity, adhesiveness with the circumference materials and the forming method thereof. Further, the forming method thereof is not in particular limited. For example, a conductive layer of such as Cu can be formed on the walls of the through holes with spattering method and in view of adhesiveness with the surrounding materials Ti or Cr can be formed at the interface thereof. Further, after forming a thin film of such as Cu serving as a seed film with spattering method, the conductive layer can be formed with electrolytic plating method. Further, electroless plating method can also be used. Still further, a resin past containing a metal such as Ag can be buried inside the through holes.

The connecting portions of the present invention provided at portions other than the end portions of the electrodes are not in particular limited, if such are electrically connected with the upper metal wiring portions, after boring through holes at the organic insulator covering the electrodes with etching method, the connecting portions can be formed together with the upper wiring layers by plating. As another through hole forming method, the through holes can be formed with photomask method by using photosensitive organic insulator material such as photosensitive polyimide and BCB as the organic insulator.

The arrangement of the respective elements of the present invention is not in particular limited, however, it is necessary to design the arrangement of the respective elements in view of the performance reduction due to a parasitic capacity caused by coupling between the respective elements and an integration rate depending on the desired size of the electronic circuit component.

For example, the electronic circuit component does not require much size reduction, it is necessary to reduce an influence between the respective elements by arranging the respective elements on the same plane or to enlarge the distance between the layers. Further, a provision of a grounded plane, namely, a grounded layer is another method.

Further, if the size reduction is desired, through forming the respective elements on both sides of the substrate, the integration rate is increased and the size is further reduced.

In order to further reduce the size, when the respective elements are formed on multiple faces in a layer lamination structure, the size is further reduced.

Further, by arranging the respective elements separately, while sandwiching the glass substrate there between, the production process is simplified and a low cost electronic circuit component can be obtained. Further, since large distances between the respective elements can be ensured, an increase of parasitic capacity due to the coupling can be prevented.

In the electronic circuit component of the present invention, it is not necessarily required that the external electrodes for electrical connection with the externals are formed on the metal end portions, however, if necessary, such can be formed thereon.

The external electrode is a conductive body for electrically connecting with the substrate on which the electronic circuit component of the present invention and the semiconductors, and specifically, a ball shaped body of solder alloy containing tin, zinc and lead, silver, copper, gold or one coated by gold are used. Further, other than the above an alloy formed by combining one or more of such as molybdenum, nickel, copper, platinum and titanium or a terminal having multi layered structure can be used. Further, as the forming method thereof, any conventional methods such as a method of transfer printing the ball shaped electrodes by using masks and a method of pattern printing can be used.

BEST MODES FOR CARRYING OUT THE INVENTION

Figure 1:
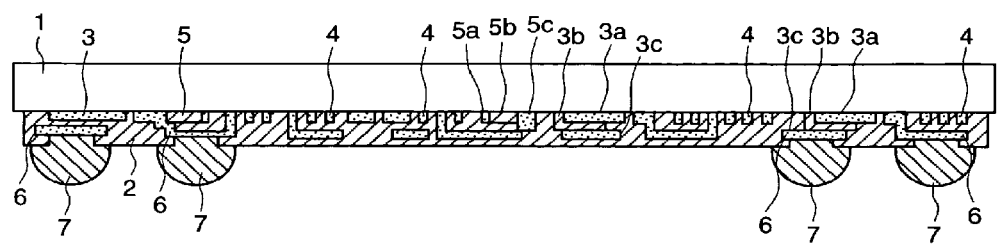
FIG. 1 is a schematic cross sectional view representing first~fourth embodiments of the present invention.

Hereinbelow, the present invention will be explained further specifically with reference to the embodiments. Further, in all the drawings for explaining the present invention, ones having the same functions are designated by the same reference numerals and repetitive explanation thereof is omitted.

Embodiment 1

FIG. 1 is a cross sectional view of an electronic circuit component representing one embodiment of the present invention. In FIG. 1, 1 is a glass substrate (product of Nippon Electric Glass Co., Ltd., BLC), and the thickness of which is 0.5 mm.

In FIG. 1, 2 is an organic insulator and photosensitive polyimide (product of Hitachi Chemical Co., Ltd., HD-6000) is used therefor.

A capacitor element 3 formed inside the organic insulator 2 is in a three layer structure constituted by a lower electrode 3a, a dielectric body 3b and an upper electrode 3c. The lower electrode 3a is composed by Cu, the dielectric body 3b by oxide of Ta and the upper electrode 3c by Cu.

An inductor element 4 is a spiral type inductor and is formed on the same plane as the upper electrode 3c of the capacitor element 3 and the material thereof is Cu.

A resistor 5 is constituted by a resistance body 5b and electrodes 5a and 5c. The resistance body 5b is a compound of Ta and Ti and the electrodes 5a and 5c are composed of Cu.

In FIG. 1, 6 is a metal terminal portion used for connection with a mounting substrate such as a print substrate and in the drawing a solder ball 7 is mounted on the metal terminal portion 6.

The manufacturing method of the electronic circuit component as shown in FIG. 1 will be explained.

A Cr film of 50 nm was formed on a glass substrate of 0.5 mm thickness with spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance the polyimide having an opening is hardened at 250° C./2 hours under nitrogen atmosphere and the organic insulator of 10 μm was formed so that the polyimide covering portion comes inside by 80 μm from the scribe area used for cutting into pieces as the electronic circuit components.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

A Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrode, electrodes for the resistors and the inductor were formed.

On the plane where the upper electrode, the electrodes for the resistor and the inductor were formed, photosensitive polyimide HD 6000 (product of Hitachi Chemical Co., Ltd.) was coated by spin coating and after prebaking with a hot plate, through exposing and developing process the opening portion for interlayer connection was formed. In this instance the polyimide having an opening is hardened at 250° C./1 hour under nitrogen atmosphere and the organic insulator was formed so that the polyimide covering portion comes inside by 80 μm from the scribe area used for cutting into pieces as the electronic circuit components.

In order to form the metal terminal portion on the organic insulator surface the electrolytic plating use seed films Cr:50 nm, Cu:500 nm were formed. On the Cu film negative type liquid state resist PMER-N-CA1000 (product of Tokyo Ohka) was spin-coated and prebaked, thereafter, a resist mask for plating was formed through exposure and development, then a plating film of 10 μm was formed by Cu electrolytic plating and further, an electrolytic nickel plating film of 2 μm was formed. Finally, after peeling off the resist and the electrolytic plating seed film, the wirings and the metal terminal portions were formed.

On the plane where the metal terminal portions were formed, photosensitive polyimide HD 6000 (product of Hitachi Chemical Co., Ltd.) was coated by spin coating and after prebaking with a hot plate, through exposing and developing process the opening portions for forming the solder balls were formed. In this instance the polyimide having an opening is hardened at 250° C./1 hour under nitrogen atmosphere and the organic insulator was formed so that the polyimide covering portion comes inside by 80 μm from the scribe area used for cutting into pieces as the electronic circuit components.

After applying electroless gold plating on the surface of the metal terminal portion and then coating solder flux on a predetermined portion with a metal mask, the external electrodes were formed by arranging the lead free solder balls having a diameter of 200 μm and performing reflow processing.

Finally, the product was separated by a dicing machine to form the electronic circuit components.

As has been explained above, by integrating the passive elements such as the inductors, capacitors and resistors, which were conventionally mounted in single parts, the mounting area can be halved and the size thereof is further reduced. Further, since a glass having a high insulation property is used for the substrate, a possible efficiency reduction of the respective elements can be prevented and efficiency of about five times in comparison with ones using the conventional silicon substrate can be obtained. Still further, the manufacturing cost is also halved in comparison with the ones using the conventional silicon substrate.

Still further, by forming the passive elements such as the capacitors, inductors and resistors at the inside from the end portion of the glass substrate, the structural portions where stresses concentratedly applied at the time of cutting out the electronic circuit components and at the time of mounting the same are designed to withstand the stresses and a possible damage on the electronic circuit components due to the applied stresses can be greatly reduced, thereby, a highly reliable electronic circuit components of a desirable manufacturing yield can be obtained.

Further, FIG. 1 structure is one embodiment of the present invention, and the arrangement of the respective elements is not limited to that shown.

Embodiment 2

In embodiment 2, in place of the glass substrate 1 used in embodiment 1 in FIG. 1, the following glass substrate was used. The composition of the glass substrate of the present embodiment contains at least one rare earth element selected among the group including Sc, Y, La, Pr, Nd, Pm, Sm, Eu, Gd, Tb, Dy, Ho, Er, Tm, Yb and Lu in an amount of 0.5-20 weight % with respect to the entire glass components when converted based on oxide of $Ln_2O_3$ (Ln is a rare earth element) and as the other components contains $SiO_2$:40~80 weight %, $B_2O_3$: 0~20 weight %, $R_2O$ ($R_2$ is alkali metal):020 weight %, RO (R is alkaline earth metal):0~20 weight % and $Al_2O_3$:0~17 weight %, and it is preferable that $R_2O$+RO are contained in an amount of 10~30 weight %. Further, the thickness thereof was 0.5 mm like embodiment 1.

Further, the portions other than the glass substrate 1 in the present embodiment are the same as those in embodiment 1.

Further, the manufacturing method of the electronic circuit components of the present embodiment is the same as that of embodiment 1.

The bending resistances of the glass substrate (product of Nippon Electric Glass Co., Ltd.) used in embodiment 1 and of the glass substrate used in embodiment 2 were respectively 200 Mpa and 300 Mpa. The bending resistances were the values measured with a four point bending meter and the shape of the samples was 10 mm×36 mm×0.5 mm. As will be apparent from the above, the strength of the glass substrate used in embodiment 2 is about two times larger than that of the glass substrate in embodiment 1.

Accordingly, the electronic circuit component of embodiment 2 shows a high reliability such as in connection with impact resistance.

Through the use of such glass substrate containing at least one rare earth element selected among the group including Sc, Y, La, Pr, Nd, Pm, Sm, Eu, Gd, Tb, Dy, Ho, Er, Tm, Yb and Lu in an amount of 0.5~20 weight % with respect to the entire glass components when converted based on oxide of $Ln_2O_3$ (Ln is a rare earth element) and as the other components contains $SiO_2$:40~80 weight %, $B_2O_3$:0~20 weight/, $R_2O$ ($R_2$ is alkali metal):0~20 weight %, RO (R is alkaline earth metal):0~20 weight % and $Al_2O_3$:0~17 weight %, and it is preferable that $R_2O$+RO are contained in an amount of 10~30 weight %, a further highly reliable electronic circuit component in addition to the advantages in embodiment 1 can be obtained.

Embodiment 3

In embodiment 3, in place of the photosensitive polyimide used in embodiment 1, BCB (product of Dow Chemical, Cycloten 4026) was used as the organic insulator 2.

Further, the portions other than the organic insulator 2 in the present embodiment are the same as those in embodiment 1.

Further, the manufacturing method of the electronic circuit component of the present embodiment is the same as that of embodiment 1.

The dielectric constant and dielectric loss tangent of BCB are respectively 2.65 and 0.003, which are respectively smaller than 3.5 and 0.01 of the photosensitive polyimide.

Accordingly, by using BCB as an insulator layer which covers the circumference of the electronic parts, the conductive loss and dielectric loss are reduced, thereby, loss of signals passing through the electronic parts can be reduced.

Through the use of BCB for the organic insulator in the present embodiment, the conductive loss and dielectric loss are reduced, thereby, an electronic circuit component having a small signal passing loss in addition to the advantages in embodiment 1 can be obtained.

Further, through the use of the glass used in embodiment 2, the electronic circuit component of course shows a high reliability such as in connection with impact resistance.

Embodiment 4

In embodiment 4, in place of the photosensitive polyimide used in embodiment 1, the low dielectric loss tangent resin composition as shown in the above chemical formula which includes a bridging component having a plurality of styrene groups as expressed by the following general chemical formula and contains polymers having average molecular weight of more than 5000 was used as the organic insulator 2.

Further, the portions other than the organic insulator 2 in the present embodiment are the same as those in embodiment 1.

Further, the manufacturing method of the electronic circuit component of the present embodiment is the same as that of embodiment 1 except for the formation method of the low dielectric loss tangent resin composition which will be explained below.

The above low dielectric loss tangent resin composition was formed in the following manner. Three kinds of raw materials of synthesized 1,2-bis(vinyl phenyl)ethane of 30 weight parts, cyclic poly olefin (product of Nihon Zeon, Zeonex 480) of 70 weight parts and curing catalyst per hexyne 25B of 0.3 weight part were resolved in xylene solvent so as to assume the solid component to be of 38% to prepare a varnish.

The varnish was coated by spin coating and baked on a hot plate under 120° C./2 min, thereafter, a step curing under 200° C./5 min was performed to form the insulator of 10 μm. On the insulator positive type liquid resist OFPR800, 500 cp (product of Tokyo Ohka) was spin-coated and dried, thereafter, through exposing and developing process a resist mask having an opening portion was formed so that the end of the opening portion comes inside the end portion of the lower electrode by 20 μm. Subsequently, the low dielectric loss tangent resin composition was dry etched by making use of $CF_4$ and the dielectric body above the lower electrode was exposed. Finally, the resist was peeled off.

The dielectric constant and dielectric loss tangent of the low dielectric loss tangent resin composition are respectively 2.45 and 0.0015, which are respectively smaller than 3.5 and 0.002 of the photosensitive polyimide and likely smaller than 2.65 and 0.003 of BCB.

Further, the cost of the resin composition is 20000 yen/kg, which is inexpensive about 1/10 in comparison with BCB, which is 230000 yen/kg.

Accordingly, by using the low dielectric loss tangent resin composition as an insulator layer which covers the circumference of the electronic parts, the conductive loss and dielectric loss are reduced, thereby, loss of signals transmission through the electronic circuits can be reduced with the low cost material.

Through the use of the low dielectric loss tangent resin composition for the organic insulator in the present embodiment, the conductive loss and dielectric loss are reduced, thereby, a low cost electronic circuit component having a small signal transmission loss in addition to the advantages in embodiment 1 can be obtained.

Further, through the use of the glass used in embodiment 2, the electronic circuit component of course shows a high reliability such as in connection with impact resistance.

Embodiment 5

Figure 2:
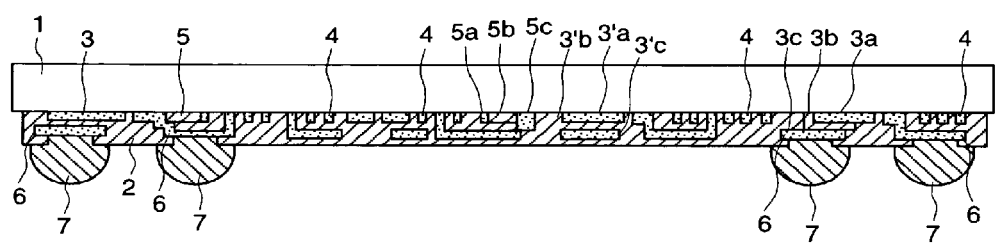
FIG. 2 is a schematic cross sectional view representing fifth embodiment of the present invention.

FIG. 2 is a cross sectional view of an electronic circuit component representing one embodiment of the present invention. In FIG. 2, 1 is a glass substrate (product of Nippon Electric Glass Co., Ltd., BLC), and the thickness of which is 0.5 mm.

In FIG. 2, 2 is an organic insulator and photosensitive polyimide (product of Hitachi Chemical Co., Ltd., HD-6000) is used therefor.

Capacitor elements formed inside the organic insulator 2 are constituted by a capacitor 3 in a three layer structure constituted by a lower electrode 3a of Cu, a dielectric body 3b of oxide of Ta and an upper electrode 3c of Cu and a capacitor 3' in a three layer structure constituted by a lower electrode 3'a of Cu, a dielectric body 3'b of polyimide and an upper electrode 3'c of Cu.

An inductor element 4 is a spiral type inductor and is formed of Cu.

A resistor 5 is constituted by a resistance body 5b and electrodes 5a and 5c. The resistance body 5b is a compound of Ta and Ti and the electrodes 5a and 5c are composed of Cu.

In FIG. 2, 6 is a metal terminal portion used for connection with a mounting substrate such as a print substrate and in the drawing a solder ball 7 is mounted on the metal terminal portion 6.

The manufacturing method of the electronic circuit component as shown in FIG. 2 will be explained.

A sand blast use film resist material (product of Tokyo Ohka, Odale) of 100 μm was laminated on the glass substrate having thickness of 0.5 mm through exposure and development process and an etching use resist was formed. Subsequently, through holes were formed in the glass substrate with micro sand blasting method. Then, the resist film was peeled off, electrolytic plating use seed films Cr:50 nm, Cu:500 nm were formed on the surface of the glass substrate and walls of the via holes with spattering method. Thereafter, on the Cu film, a plating use film resist (product of Hitachi Chemical Co., Ltd., HN 920) was laminated and a resist mask was formed through exposure and development, then, conductive layers were formed inside the via holes by Cu electrolytic plating. Subsequently, the resist and the electrolytic plating seed film were peeled off.

A Cr film of 50 nm was formed on a glass substrate of 0.5 mm thickness with spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode 3a by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, a dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode 3a was exposed. In this instance the polyimide having an opening is hardened at 250° C./2 hours under nitrogen atmosphere and the organic insulator of 10 μm was formed so that the polyimide covering portion comes inside by 80 μm from the scribe area used for cutting into pieces as the electronic circuit components. The organic insulator formed above the lower electrode 3'a according to the above process is the dielectric body 3'b.

Then, a TaN film of 500 nm was formed with spattering method. On the film positive type liquid state resist OFPR800, 100 cp was spin-coated and prebaked, thereafter, a resist pattern mask was formed through exposure and development. By using the mask The TaN film was dry etched with $CF_4$. Then plural resistor elements were formed by peeling off the resist.

A Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrode, electrodes for the resistors and the inductor were formed.

On the plane where the upper electrode, the electrodes for the resistor and the inductor were formed, photosensitive polyimide HD 6000 (product of Hitachi Chemical Co., Ltd.) was coated by spin coating and after prebaking with a hot plate, through exposing and developing process the opening portion for interlayer connection was formed. In this instance the polyimide having an opening is hardened at 250° C./1 hour under nitrogen atmosphere and the organic insulator was formed so that the polyimide covering portion comes inside by 80 μm from the scribe area used for cutting into pieces as the electronic circuit components.

In order to form the metal terminal portion on the organic insulator surface the electrolytic plating use seed films Cr:50 nm, Cu:500 nm were formed. On the Cu film negative type liquid state resist PMER-N-CA1000 (product of Tokyo Ohka) was spin-coated and prebaked, thereafter, a resist mask for plating was formed through exposure and development, then, a plating film of 10 μm was formed by Cu electrolytic plating and further, an electrolytic nickel plating film of 2 μm was formed. Finally, after peeling off the resist and the electrolytic plating seed film, the wirings and the metal terminal portions were formed.

On the plane where the metal terminal portions were formed, photosensitive polyimide HD 6000 (product of Hitachi Chemical Co., Ltd.) was coated by spin coating and after prebaking with a hot plate, through exposing and developing process the opening portions for forming the solder balls were formed. In this instance the polyimide having an opening is hardened at 250° C./1 hour and the organic insulator was formed so that the polyimide covering portion comes inside by 80 μm from the scribe area used for cutting into pieces as the electronic circuit components.

After applying electroless gold plating on the surface of the metal terminal portion and then coating solder flux on a predetermined portion with a metal mask, the external electrodes were formed by arranging the lead free solder balls having a diameter of 200 μm and performing reflow processing.

Finally, the product was separated by a dicing machine to form the electronic circuit components.

In the present embodiment, through the use of the inorganic material having a high dielectric constant such as the oxide of Ta as well as the organic material having a low dielectric constant such as the polyimide as the dielectric body material, capacitors having a small capacitance can be formed accurately, which enhances reliability of the circuits and expands available capacitance range. Further, through the use of the same material for the dielectric body as the insulator material, which covers the circumference of the elements, the semiconductor connection substrate can be manufactured in further simplified and low cost processes in addition to the advantages obtained in embodiment 1.

Further, through the use of the glass used in embodiment 2, the electronic circuit component of course shows a high reliability such as in connection with impact resistance.

Through the use of BCB organic insulator used in embodiment 3 for the organic insulator in the present embodiment, the conductive loss and dielectric loss are reduced, thereby the signal transmission loss in the electronic circuit can be reduced.

Further, by using the low dielectric loss tangent resin composition as used in embodiment 4 as the insulator layer, the conductive loss and dielectric loss are reduced, thereby, loss of signals transmitting through the electronic circuits can be reduced with the low cost material.

Further, FIG. 2 structure is one embodiment of the present invention, and the arrangement of the respective elements is not limited to that shown.

Embodiment 6

Figure 3:
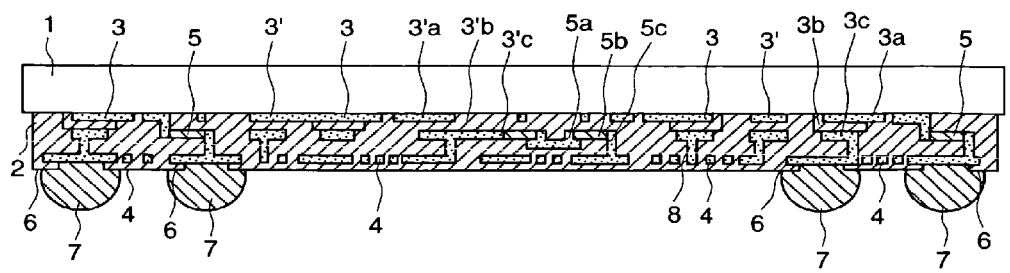
FIG. 3 is a schematic cross sectional view representing sixth embodiment of the present invention.

FIG. 3 is a cross sectional view of a semiconductor connection substrate representing one embodiment of the present invention. In FIG. 3, 1 is a glass substrate (product of Nippon Electric Glass Co., Ltd., BLC), and the thickness of which is 0.5 mm.

In FIG. 3, 2 is an organic insulator and photosensitive polyimide (product of Hitachi Chemical Co., Ltd., HD-6000) is used therefor.

Capacitor elements formed inside the organic insulator 2 are constituted by a capacitor 3 in a three layer structure constituted by a lower electrode 3a of Cu, a dielectric body 3b of oxide of Ta and an upper electrode 3c of Cu and a capacitor 3' in a three layer structure constituted by a lower electrode 3'a of Cu, a dielectric body 3'b of polyimide and an upper electrode 3'c of Cu. Further, on the upper electrodes connecting portions 8 for connecting the same with wirings on the upper layer are provided.

An inductor element 4 is a spiral type inductor and is formed of Cu.

A resistor 5 is constituted by a resistance body 5b and electrodes 5a and 5c. The resistance body 5b is a compound of Ta and Ti and the electrodes 5a and 5c are composed of Cu.

In FIG. 3, 6 is a metal terminal portion used for connection with a mounting substrate such as a print substrate and in the drawing a solder ball 7 is mounted on the metal terminal portion 6.

Figure 4:
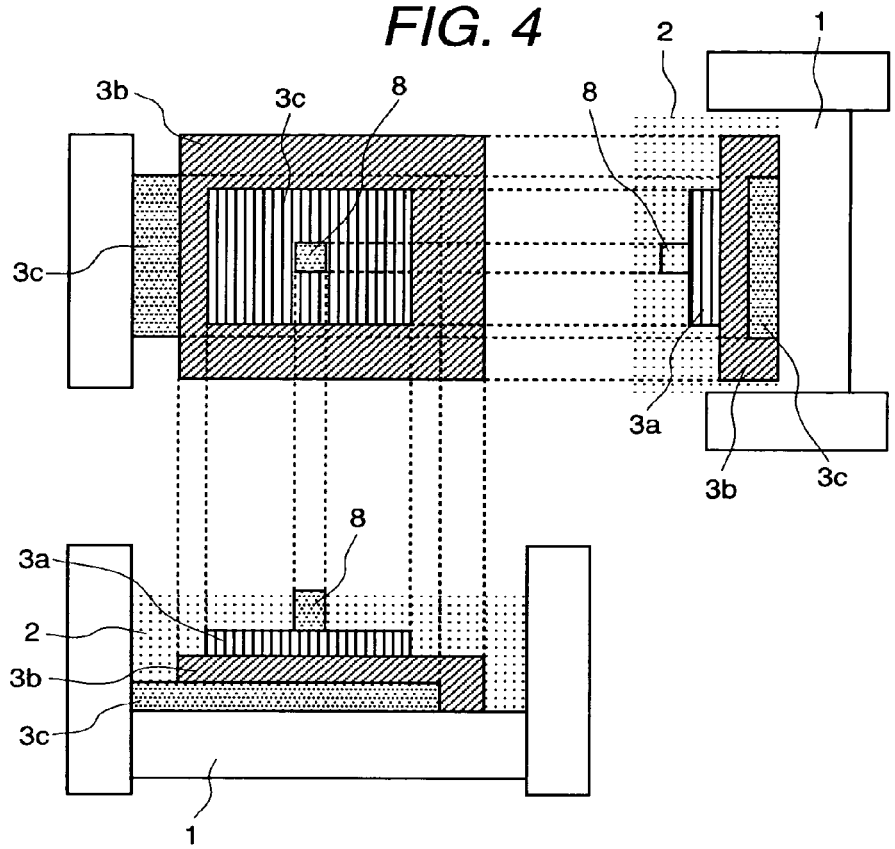
FIG. 4 is a view showing a capacitor element in the sixth embodiment of the present invention.

Further, FIG. 4 shows parts of the capacitor element in FIG. 3. In the capacitor in FIG. 4, the dielectric body 3b is formed so as to cover the side faces of the lower electrode 3c and a reduction of defects due to current leakage between the upper and lower electrodes is achieved. Since the area of the upper electrode is formed smaller than that of the lower electrode, the capacitance of the capacitor is determined based on the area of the upper electrode. For the connection between the upper electrode 3c and the wirings on the upper layer, as shown in FIG. 4, from a portion other than the end portion of the upper electrode 3c a wiring is lead out through a via hole in the organic insulator 2 to the upper layer to complete the connection. However, when the connection is performed by leading out the wiring from the side face of the upper electrode, the area of the led out portion of the wiring facing the lower electrode operates to form a part of the capacitance, therefore, when forming the capacitor, a high level of accuracy is required. In contrast, when the connecting portions 8 are used, the connecting portions do not affect the capacitance of the capacitor, thus, a highly accurate capacitor can be formed.

The manufacturing method of the electronic circuit component as shown in FIG. 3 will be explained.

A sand blast use film resist material (product of Tokyo Ohka, Odale) of 100 μm was laminated on the glass substrate having thickness of 0.5 mm through exposure and development process and an etching use resist was formed. Subsequently, through holes were formed in the glass substrate with micro sand blasting method. Then, the resist film was peeled off, electrolytic plating use seed films Cr:50 nm, Cu:500 nm were formed on the surface of the glass substrate and walls of the via holes with spattering method. Thereafter, on the Cu film, a plating use film resist (product of Hitachi Chemical Co., Ltd., HN 920) was laminated and a resist mask was formed through exposure and development, then, conductive layers were formed inside the via holes by Cu electrolytic plating. Subsequently, the resist and the electrolytic plating seed film were peeled off.

A Cr film of 50 nm was formed on a glass substrate of 0.5 mm thickness with spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, a dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance, the polyimide layer was opened so that the end portion of the opening was located at the inner side from the end of the lower electrode by 20 μm. The polyimide is hardened at 250° C./2 hours under nitrogen atmosphere to form the organic insulator of 10 μm. Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrodes were formed.

On the plane where the upper electrodes were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

A Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the electrodes for the resistors were formed.

On the plane where the electrodes for the resistor were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the inductor elements, wirings and metal terminal portions were formed.

On the plane where the metal terminal portions, inductor elements and wirings were formed, photosensitive polyimide HD 6000 (product of Hitachi Chemical Co., Ltd.) was coated by spin coating and after prebaking with a hot plate, through exposing and developing process the opening portions for forming the solder balls were formed and the polyimide was hardened at 250° C./1 hour to form the organic insulator.

After applying electroless gold plating on the surface of the metal terminal portion and then coating solder flux on a predetermined portion with a metal mask, the external electrodes were formed by arranging the lead free solder balls having a diameter of 200 μm and performing reflow processing.

Finally, the product was separated by a dicing machine to form the electronic circuit components.

In the present embodiment, since the capacitor elements, inductor elements and resistor elements are respectively arranged at a plurality of different distances from the surface of the glass substrate, the respective elements can be integrated in further high density, therefore, a further small sized electronic circuit component can be obtained in addition to the advantages obtained in embodiment 5.

Further, through the use of the glass used in embodiment 2, the electronic circuit component of course shows a high reliability such as in connection with impact resistance.

Through the use of BCB organic insulator used in embodiment 3 for the organic insulator in the present embodiment, the conductive loss and dielectric loss are reduced, thereby, an electronic circuit component having a small signal transmission loss can be obtained.

Further, by using the low dielectric loss tangent resin composition as used in embodiment 4 as the insulator layer, the conductive loss and dielectric loss are reduced, thereby, loss of signals transmitting through the electronic circuits can be reduced with the low cost material.

Further, FIG. 3 structure is one embodiment of the present invention, and the arrangement of the respective elements is not limited to that shown.

Embodiment 7

Figure 5:
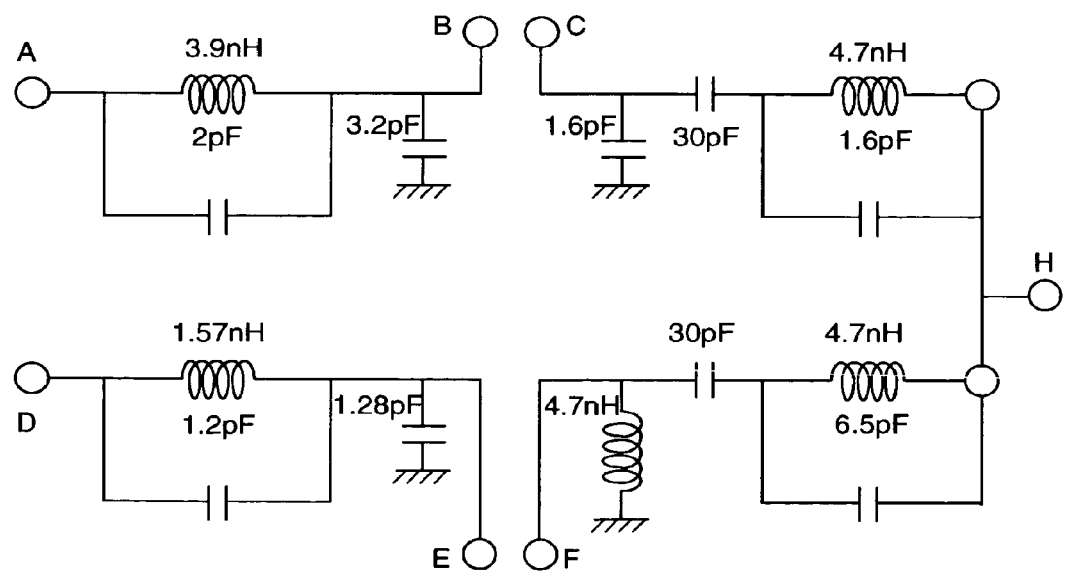
FIG. 5 is a circuit diagram of the electronic circuit component representing a seventh embodiment of the present invention.
Figure 6:
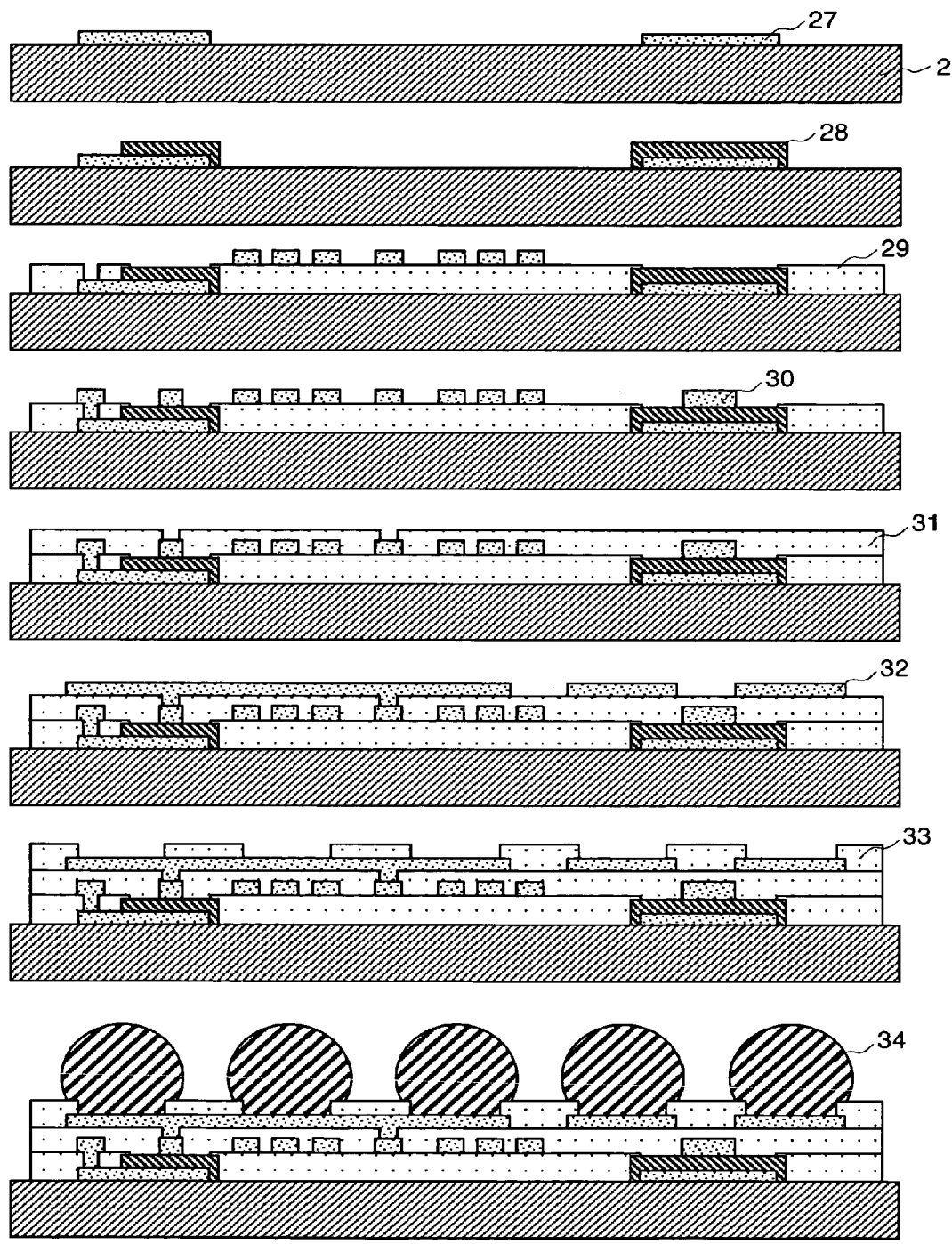
FIG. 6 is a schematic cross sectional view of the seventh embodiment of the present invention.
Figure 7:
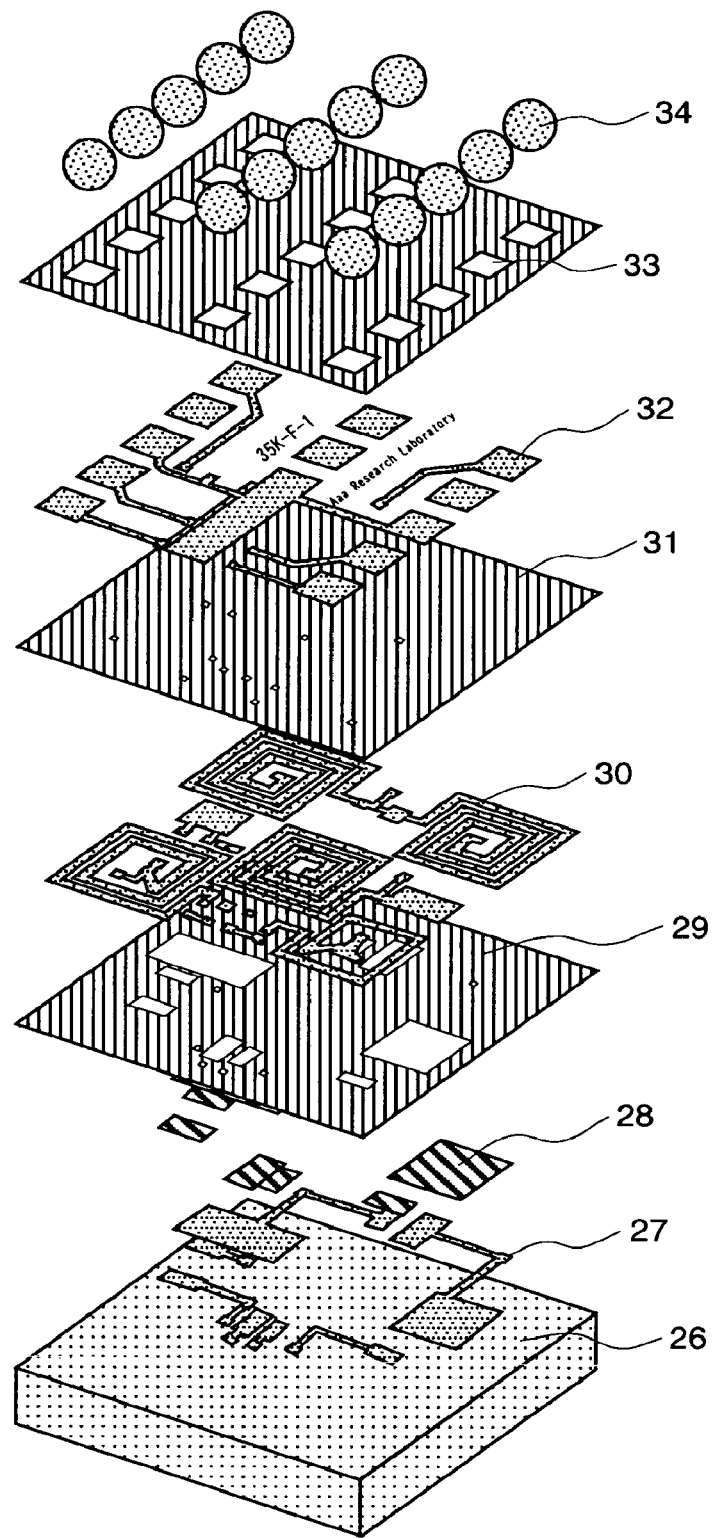
FIG. 7 is an exploded view of the seventh embodiment of the present invention.

As the seventh embodiment, an example of an electronic circuit component in which an LC filter circuit as shown in FIG. 5 is formed in one chip. FIG. 6 is a cross sectional view of the electronic circuit component representing an embodiment of the present invention. FIG. 7 is an exploded view of the electronic circuit component according to the present embodiment. Further, FIGS. 8 through 14 are plane views of the respective layers as shown in the exploded view of FIG. 7. Still further, the cross sectional view in FIG. 6 shows one being taken along the dotted line A-A in FIGS. 8 through 14.

Figure 8:
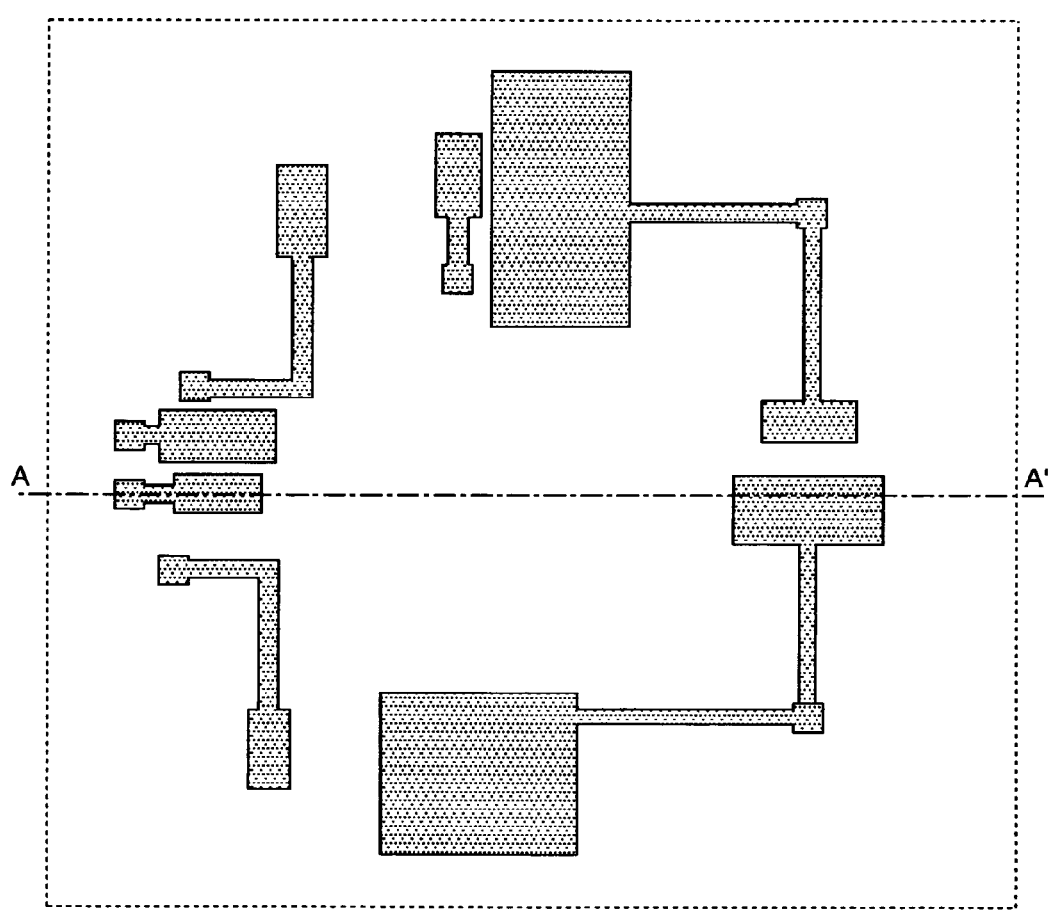
FIGS. 8 through 14 are plane pattern diagrams of respective layers in the seventh embodiment of the present invention.
Figure 9:
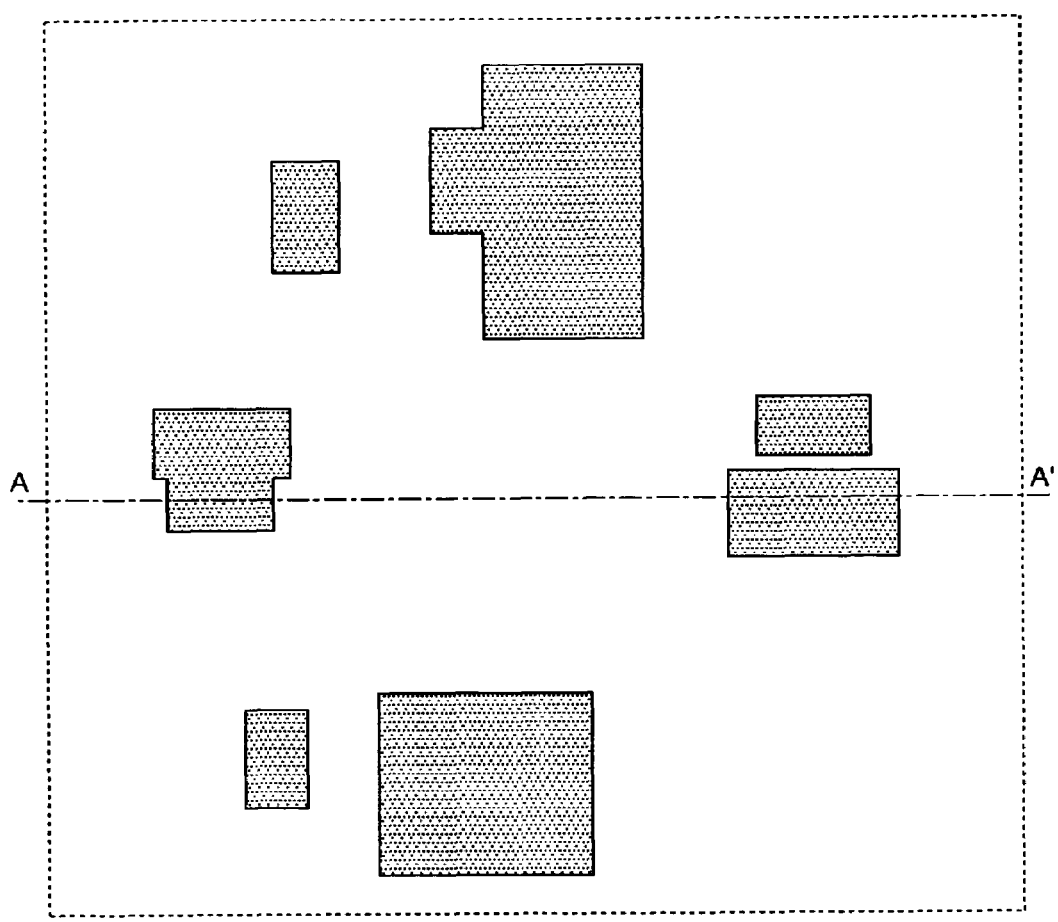
Figure 10:
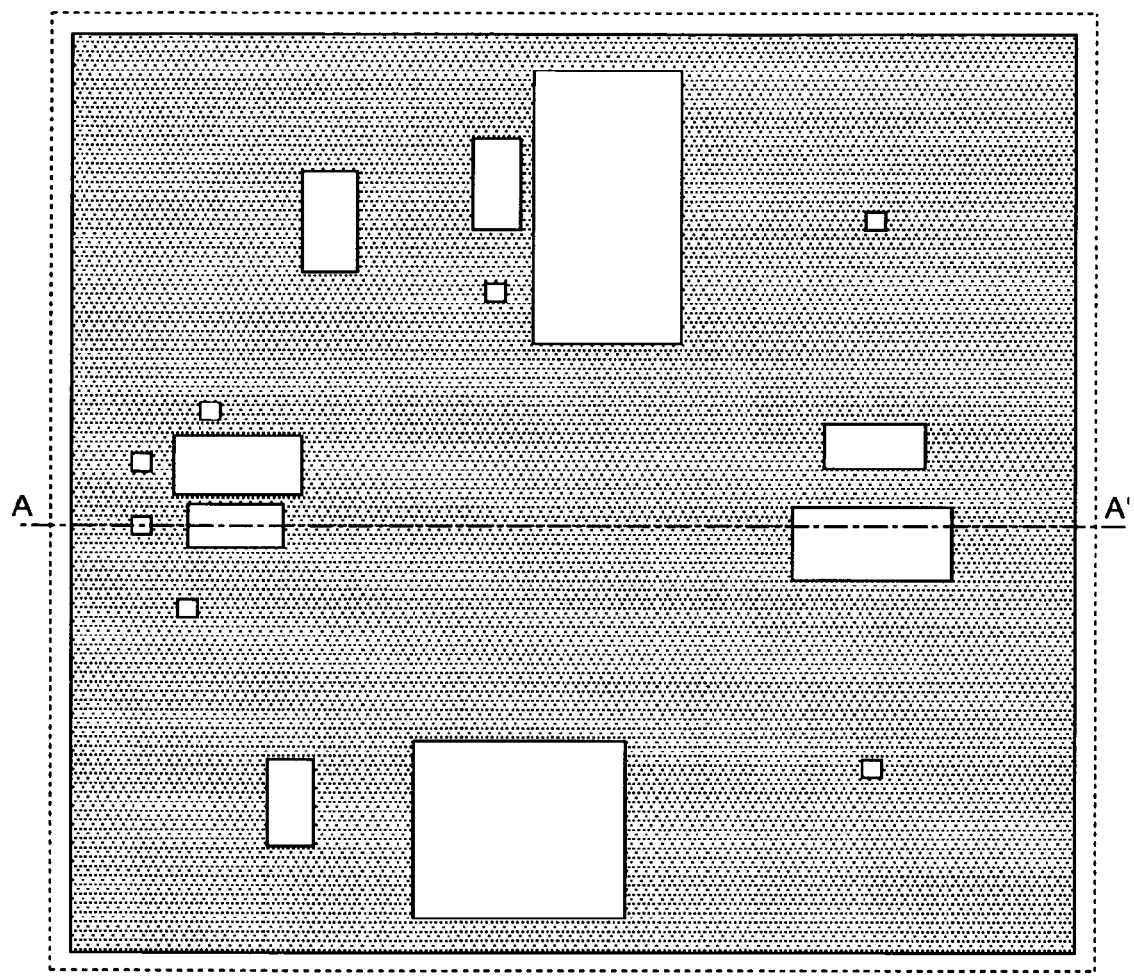
Figure 11:
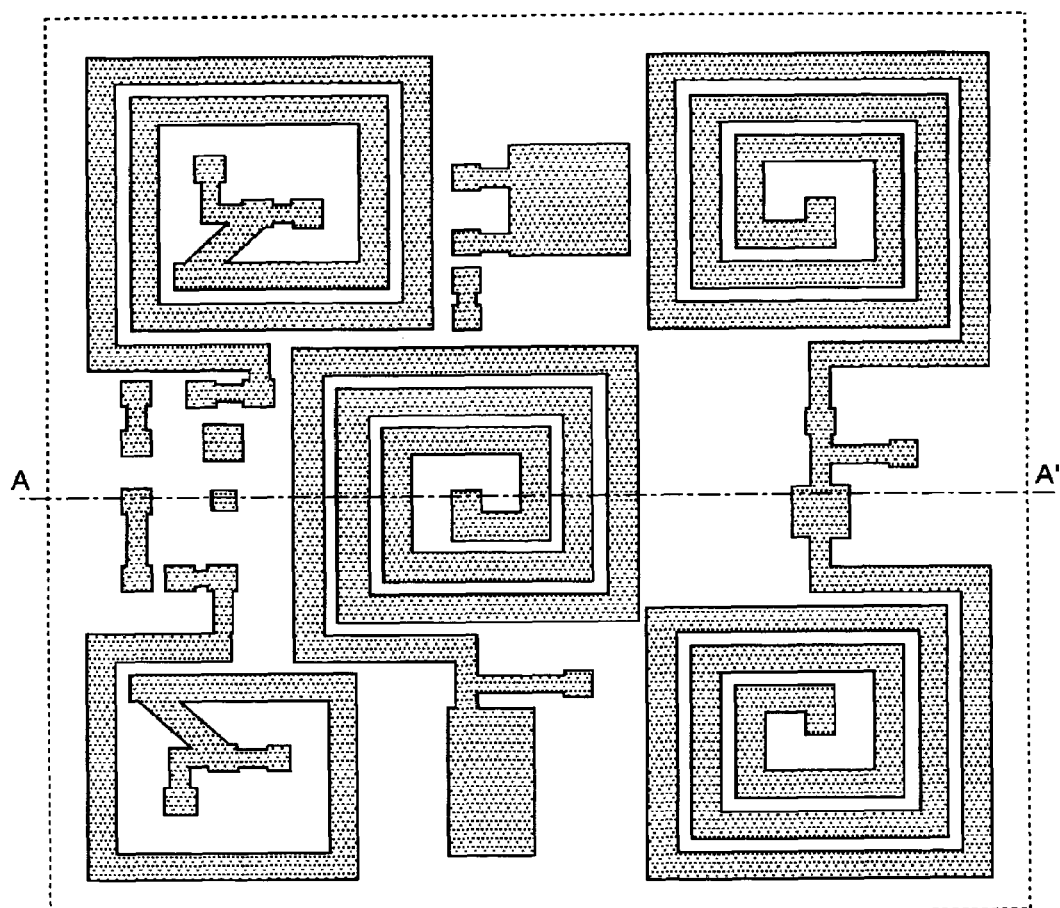
Figure 12:
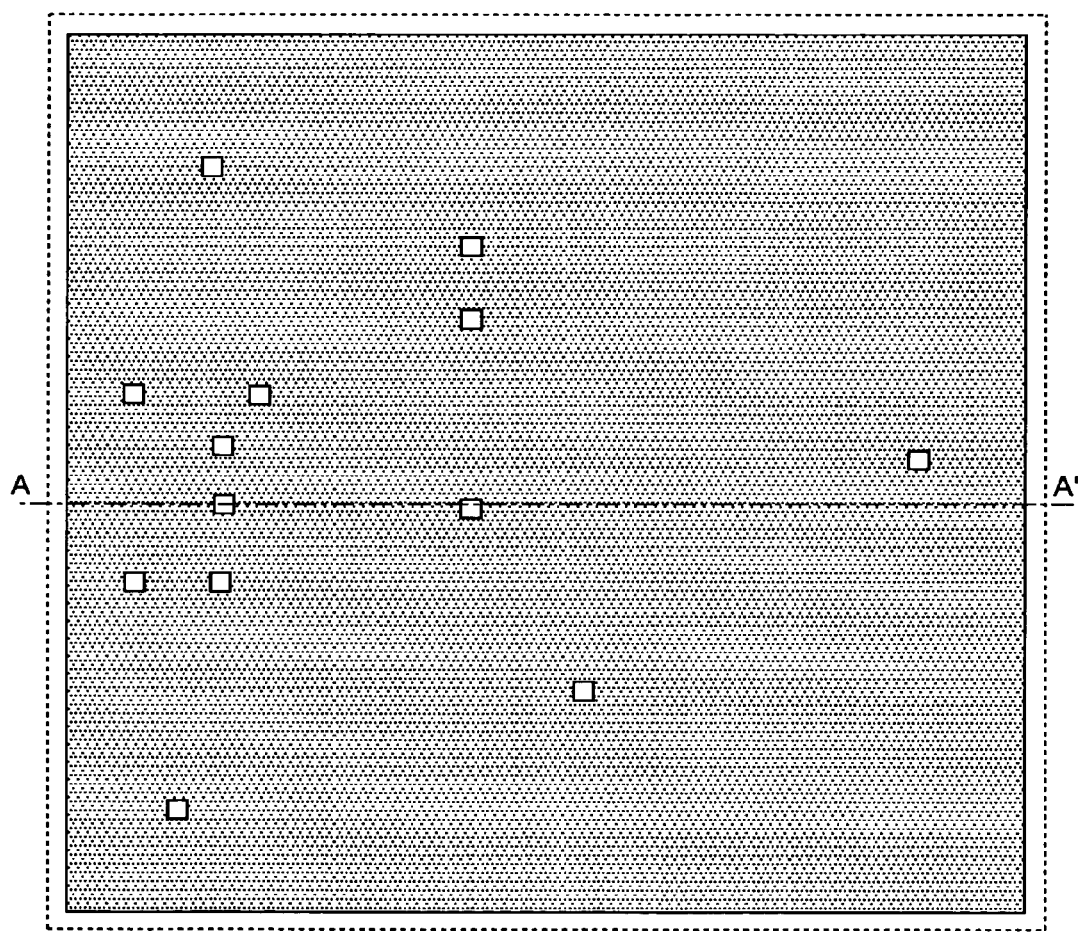
Figure 13:
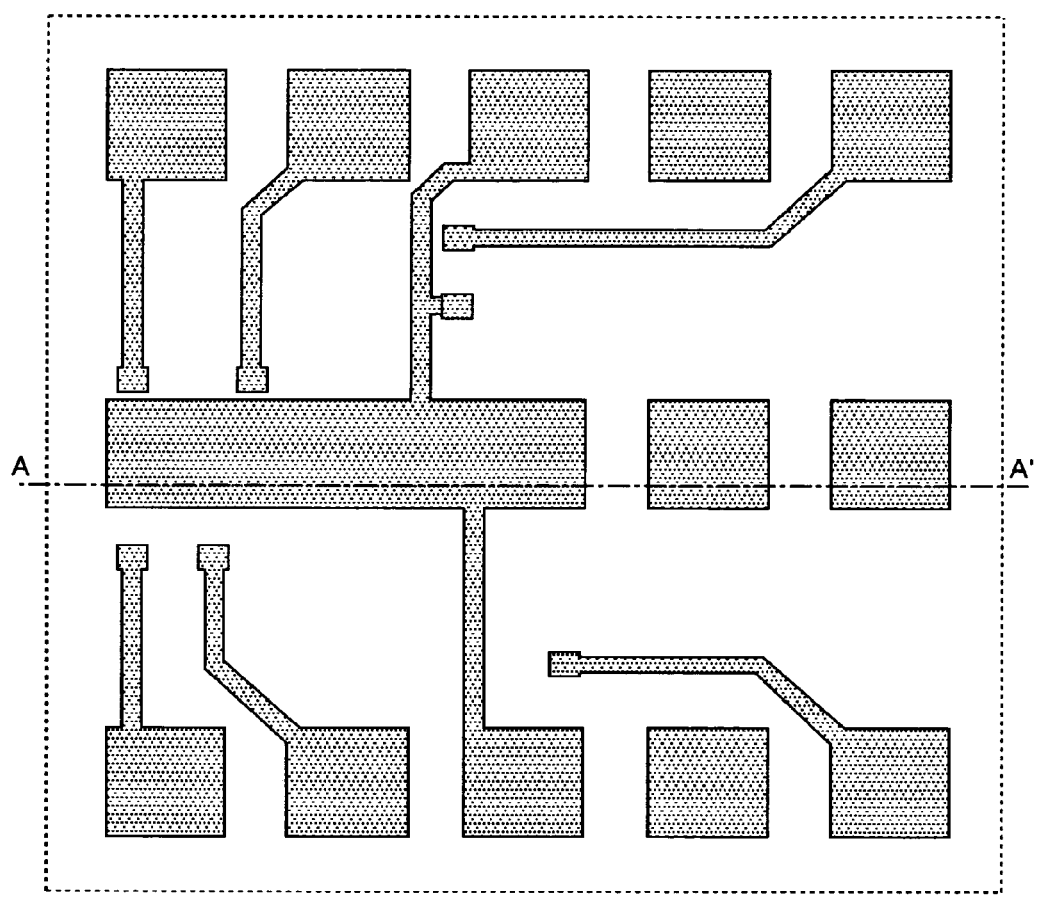
Figure 14:
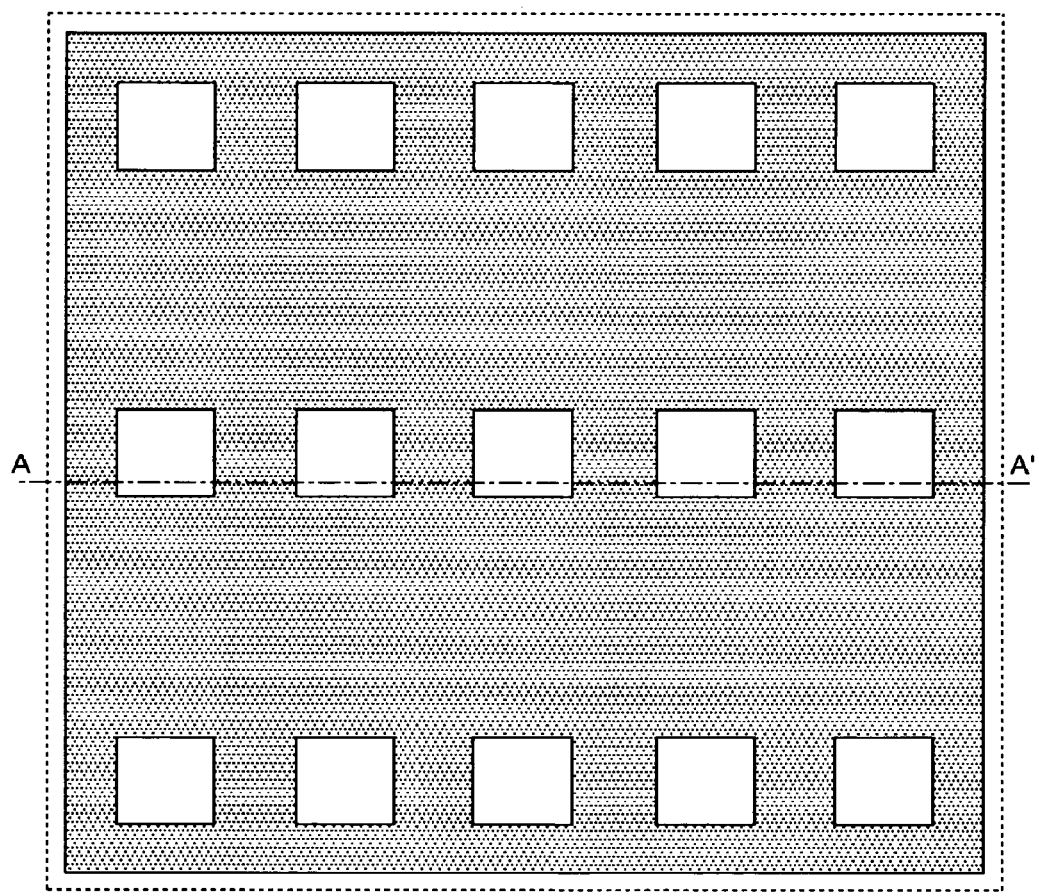

In FIGS. 6 and 7, 26 is a glass substrate (product of Nihon Denki Glass, BLC) and of which thickness was 0.5 mm and size was 2 mm×2 mm. 27 is a lower electrode layer made of Cu and of which plane view is shown in FIG. 8. 28 is a dielectric body layer made of oxide of Ta and of which plane view is shown in FIG. 9. 29 is an organic insulator layer and of which plane view is shown in FIG. 10. 30 is a layer serving as an inductor layer and an upper electrode and of which plane view is shown in FIG. 11. 31 is another organic insulator and of which plane view is shown in FIG. 12. 32 is an electrode layer for connecting between a wiring and an external terminal and of which plane view is shown in FIG. 13. 33 is a surface protective layer made of an organic insulator and of which plane view is shown in FIG. 14. 34 is an external electrode for a solder ball. The lower electrode 27 made of Cu, the layer 30 serving as the inductor layer and the upper electrode and the electrode layer 32 connecting the wiring and the external terminal are connected through via holes formed in the organic insulator layers 29 and 31 provided in the respective interlayers.

The manufacturing method of the electronic circuit component will be explained.

A Cr film of 50 nm was formed on a glass substrate 26 of 0.5 mm thickness with spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode 27 was formed. The lower electrode layer 27 serves as a lower electrode and a wiring for a capacitor element.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, a dry etch was performed by making use of $CF_4$ to remove unnecessary portion thereof and further, unnecessary portion of the barrier layer was removed with Cr etching liquid of permanganic acid, then, the resist mask was removed and the dielectric layer 28 was formed. In this instance, the dielectric layer 28 was formed so as to cover the side face of the lower electrode.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance, the polyimide layer was opened so that the end portion of the opening was located at the inner side from the end of the lower electrode by 20 μm. The polyimide is hardened at 250° C./2 hours under nitrogen atmosphere to form the organic insulator layer 29 of 10 μm. Further, in the organic insulator layer 29 via holes are formed for connecting the lower electrode layer 27 and a wiring on the upper layer thereof.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrode and the inductor element 30 were formed. Herein, through forming the upper electrode and the inductor element on the same layer, the distance between the inductor element and the capacitor element is shortened, thereby, the size and noise reduction of the electronic circuit component is achieved with a high efficiency and a high performance. Further, in the present embodiment, as shown in the plane view of FIG. 11, a capacitor element is formed even in the area of the inductor element. Through such arrangement, the distance between the inductor element and the capacitor element is shortened and the occupying area of the capacitor element is saved which permits size reduction of the electronic circuits.

On the plane where the upper electrode and the inductor element 30 were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator layer 31. Herein, since the opening portion for performing the interlayer connection between the upper electrode and the upper layer thereof is formed so as to locate in the face where the upper electrode is formed, the area of the upper electrode for the capacitor element can be easily controlled, which enhances accuracy of the capacitor element.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the wirings and external electrode layer 32 were formed.

On the plane where the wiring and external electrode layer 32 metal end portions were formed, photosensitive polyimide HD 6000 (product of Hitachi Chemical Co., Ltd.) was coated by spin coating and after prebaking with a hot plate, through exposing and developing process the opening portion for solder balls were formed and the polyimide was hardened at 250° C./1 hour to form the organic insulator layer 33.

After applying electroless gold plating on the surface of the wiring and external electrode and then coating solder flux on a predetermined portion with a metal mask, the external electrodes 34 were formed by arranging the lead free solder balls having a diameter of 200 μm and performing reflow processing. The external electrode 34 is arranged in a grid shape as shown in FIG. 7 so as to ease mounting such as on an external wiring substrate.

Finally, the product was separated by a dicing machine to form the electronic circuit components.

In the present embodiment, since the LC filter circuit, which was conventionally formed as a single discrete component is integrated on a substrate, the size, resistance, inductance and noise of the electronic circuit component can be realized.

Further, through the use of the glass used in embodiment 2, the electronic circuit component of course shows a high reliability such as in connection with impact resistance.

Through the use of BCB organic insulator used in embodiment 3 for the organic insulator in the present embodiment, the conductive loss and dielectric loss are reduced, thereby, an electronic circuit component having a small signal transmission loss can be obtained.

Further, by using the low dielectric loss tangent resin composition as used in embodiment 4 as the insulator layer, the conductive loss and dielectric loss are reduced, thereby, loss of signals transmitting through the electronic circuits can be reduced with the low cost material.

Further, FIG. 5 structure is one embodiment of the present invention, and the arrangement of the respective elements is not limited to that shown.

Embodiment 8

Figure 15:
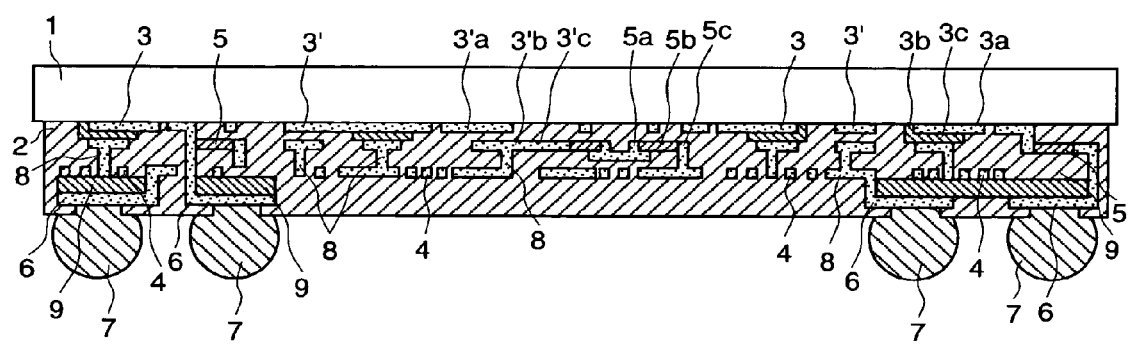
FIG. 15 is a schematic cross sectional view representing eighth embodiment of the present invention.

FIG. 15 is a cross sectional view of an electronic circuit component representing one embodiment of the present invention. In FIG. 15, 1 is a glass substrate (product of Nippon Electric Glass Co., Ltd., BLC), and the thickness of which is 0.5 mm.

In FIG. 15, 2 is an organic insulator and photosensitive polyimide (product of Hitachi Chemical Co., Ltd., HD-6000) is used therefor.

Capacitor elements formed inside the organic insulator 2 are constituted by a capacitor 3 in a three layer structure constituted by a lower electrode 3a of Cu, a dielectric body 3b of oxide of Ta and an upper electrode 3c of Cu and a capacitor 3' in a three layer structure constituted by a lower electrode 3'a of Cu, a dielectric body 3'b of polyimide and an upper electrode 3'c of Cu. Further, on the upper electrodes connecting portions 8 for connecting the same with the upper wirings are provided.

An inductor element 4 is a spiral type inductor and is formed of Cu.

A resistor 5 is constituted by a resistance body 5b and electrodes 5a and 5c. The resistance body 5b is a compound of Ta and Ti and the electrodes 5a and 5c are composed of Cu.

In FIG. 15, 9 is an organic insulator having a function of buffering stress. For the organic insulator having the stress buffering function, a liquid polyimide material in which polyimide fine particles are dispersed (product of Hitachi Chemical Co., Ltd., GH-P500) was used.

In FIG. 15, 6 is a metal terminal portion used for connection with a mounting substrate such as a print substrate and in the drawing a solder ball 7 is mounted on the metal terminal portion 6.

The manufacturing method of the electronic circuit component as shown in FIG. 15 will be explained.

A Cr film of 50 nm was formed on a glass substrate of 0.5 mm thickness with spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, a dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance, the polyimide layer was opened so that the end portion of the opening was located at the inner side from the end of the lower electrode by 20 μm. The polyimide is hardened at 250° C./2 hours under nitrogen atmosphere to form the organic insulator of 10 μm.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrodes were formed.

On the plane where the upper electrodes were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Then, a TaN film of 500 nm was formed with spattering method. On the film, positive type liquid state resist OFPR800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

A Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the electrodes for the resistors were formed.

On the plane where the electrodes for the resistor were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the inductor elements and wirings were formed.

Thereafter, the liquid polyimide material GH-P 500 in which polyimide fine particles are dispersed (product of Hitachi Chemical Co., Ltd.) was print coated by using a mask, heated on a hot plate at 200° C./25 min and hardened in a constant temperature bath at 250° C./60 min to form the organic insulator having stress buffering function.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 1 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the wirings and metal end portions were formed.

On the plane where the wiring and metal end portions were formed, photosensitive polyimide HD 6000 (product of Hitachi Chemical Co., Ltd.) was coated by spin coating and after prebaking with a hot plate, through exposing and developing process the opening portion for solder balls were formed and the polyimide was hardened at 250° C./1 hour to form the organic insulator.

After applying electroless gold plating on the surface of the metal terminal portion and then coating solder flux on a predetermined portion with a metal mask, the external electrodes were formed by arranging the lead free solder balls having a diameter of 200 μm and performing reflow processing.

Finally, the product was separated by a dicing machine to form the electronic circuit components.

In the present embodiment, since the organic insulator having stress buffering function is formed immediately below the metal terminal portion 6, when being connected to a mounting substrate such as a print substrate, a thermal stress applied to the metal terminal portion 6 and the solder ball 7 due to difference of thermal expansion coefficients between the semiconductor connection substrate and the mounting substrate can be relaxed. Thereby, a semiconductor connection substrate having excellent heart resistance cycle can be obtained in addition to the advantages obtained in embodiment 6.

Further, through the use of the glass used in embodiment 2, the electronic circuit component of course shows a high reliability such as in connection with impact resistance.

Through the use of BCB organic insulator used in embodiment 3 for the organic insulator in the present embodiment, the conductive loss and di electric loss are reduced, thereby, an electronic circuit component having a small signal transmission loss can be obtained.

Further, by using the low dielectric loss tangent resin composition as used in embodiment 4 as the insulator layer, the conductive loss and dielectric loss are reduced, thereby, loss of signals transmitting through the electronic circuits can be reduced with the low cost material.

Further, FIG. 15 structure is one embodiment of the present invention, and the arrangement of the respective elements is not limited to that shown.

Embodiment 9

Figure 16:
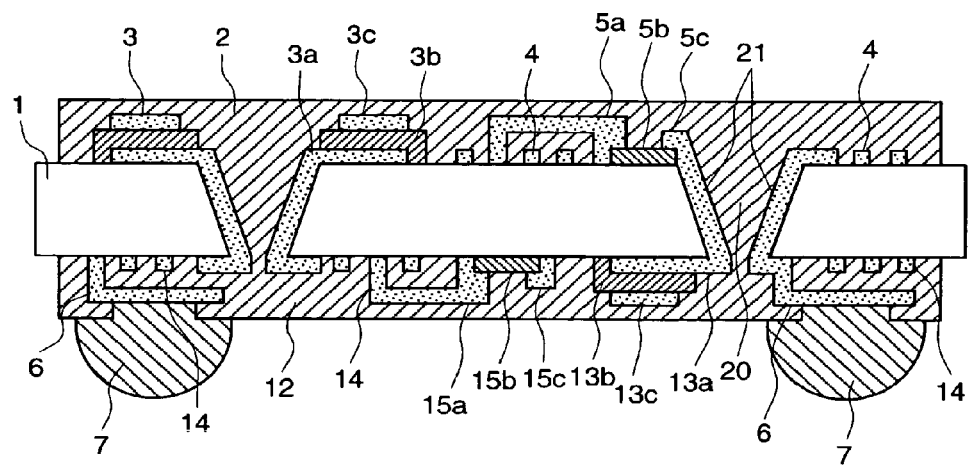
FIG. 16 is a schematic cross sectional view representing ninth embodiment of the present invention.

FIG. 16 is a cross sectional view of an electronic circuit component representing one embodiment of the present invention. In FIG. 16, 1 is a glass substrate (product of Nippon Electric Glass Co., Ltd., BLC), and the thickness of which is 0.5 mm.

In FIG. 16, 2 is an organic insulator and photosensitive polyimide (product of Hitachi Chemical Co., Ltd., HD-6000) is used therefor.

All of capacitor elements 3 formed inside the organic insulator 2 are in a three layer structure constituted by a lower electrode 3a, a dielectric body 3b and an upper electrode 3c. The lower electrode 3a is constituted of Cu, the dielectric body 3b of oxide of Ta and the upper electrode 3c of Cu.

An inductor element 4 is a spiral type inductor and is formed on the same plane as the upper electrode 3c of the capacitor element 3 and the material thereof is Cu.

A resistor 5 is constituted by a resistance body 5b and electrodes 5a and 5c. The resistance body 5b is a compound of Ta and Ti and the electrodes 5a and 5c are composed of Cu.

In FIG. 16, 12 is another insulator using photosensitive polyimide (product of Hitachi Chemical Co., Ltd., HD-6000).

All of capacitor elements 13 formed inside the organic insulator 12 are in a three layer structure constituted by a lower electrode 13a, a dielectric body 13b and an upper electrode 13c. The lower electrode 13a is constituted of Cu, the dielectric body 13b of oxide of Ta and the upper electrode 13c of Cu.

An inductor element 14 is a spiral type inductor and is formed on the same plane as the upper electrode 13c of the capacitor element 13 and the material thereof is Cu.

A resistor 15 is constituted by a resistance body 15b and electrodes 15a and 15c. The resistance body 15b is a compound of Ta and Ti and the electrodes 15a and 15c are composed of Cu.

In FIG. 16, the respective elements formed inside the organic insulators 2 and 12 are electrically connected via conductor portions filled in through holes 20 formed in the glass substrate so as to provide a predetermined functions.

In FIG. 16, 6 is a metal terminal portion used for connection with a mounting substrate such as a print substrate and in the drawing a solder ball 7 is mounted on the metal terminal portion 6.

The manufacturing method of the electronic circuit component as shown in FIG. 16 will be explained.

A sand blast use film resist material (product of Tokyo Ohka, Odale) of 100 μm was laminated on the glass substrate having thickness of 0.5 mm through exposure and development process and an etching use resist was formed. Subsequently, through holes were formed in the glass substrate with micro sand blasting method. Then, the resist film was peeled off, electrolytic plating use seed films Cr: 50 nm, Cu: 500 nm were formed on the surface of the glass substrate and walls of the via-holes with spattering method. Thereafter, on the Cu film, a plating use film resist (product of Hitachi Chemical Co., Ltd., HN 920) was laminated and a resist mask was formed through exposure and development, then, conductive layers were formed inside the via holes by Cu electrolytic plating. Subsequently, the resist and the electrolytic plating seed film were peeled off.

A Cr film of 50 nm was formed on the main surface of a glass substrate spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1

A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance a covering portion of the polyimide was opened inside from the scribe area by 80 μm used for cutting into pieces as the electronic circuit components. The ployimide was hardened at 250° C./2 hours under nitrogen atmosphere to form the organic insulator of 10 μm.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrode, electrodes for the resistors and the inductor element were formed.

On the plane where the upper electrode, the electrodes for the resistor and the inductor were formed, photosensitive polyimide HD 6000 (product of Hitachi Chemical Co., Ltd.) was coated by spin coating and after prebaking with a hot plate, the same was exposed and developed. In this instance the polyimide covering portion was opened so that the polyimide covering portion comes inside by 80 μm from the scribe area used for cutting into pieces as the semiconductor connection substrates. The polyimide having the opening was hardened at 250° C./1 hour under nitrogen atmosphere and the organic insulator was formed.

A Cr film of 50 nm was formed on the back surface of the glass substrate with spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1

A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance the polyimide having an opening is hardened at 250° C./2 hours under nitrogen atmosphere and the organic insulator of 10 μm was formed so that the polyimide covering portion comes inside by 80 μm from the scribe area used for cutting into pieces as the electronic circuit components.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 m was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrode, electrodes for the resistors and the inductor element were formed.

On the plane where the upper electrode, the electrodes for the resistor and the inductor were formed, photosensitive polyimide HD 6000 (product of Hitachi Chemical Co., Ltd.) was coated by spin coating and after prebaking with a hot plate, through exposing and developing process the opening portion for interlayer connection was formed. In this instance the polyimide having an opening is hardened at 250° C./1 hour under nitrogen atmosphere and the organic insulator was formed so that the polyimide covering portion comes inside by 80 μm from the scribe area used for cutting into pieces as the electronic circuit components.

In order to form the metal terminal portion on the organic insulator surface the electrolytic plating use seed films Cr:50 nm, Cu:500 nm were formed. On the Cu film negative type liquid state resist PMER-N-CA1000 (product of Tokyo Ohka) was spin-coated and prebaked, thereafter, a resist mask for plating was formed through exposure and development then, a plating film of 10 μm was formed by Cu electrolytic plating and further, an electrolytic nickel plating film of 2 μm was formed. Finally, after peeling off the resist and the electrolytic plating seed film, the wirings and the metal terminal portions were formed.

On the plane where the metal terminal portions were formed, photosensitive polyimide HD 6000 (product of Hitachi Chemical Co., Ltd.) was coated by spin coating and after prebaking with a hot plate, through exposing and developing process the opening portions for forming the solder balls were formed. In this instance the polyimide having an opening is hardened at 250° C./1 hour under nitrogen atmosphere and the organic insulator was formed so that the polyimide covering portion comes inside by 80 μm from the scribe area used for cutting into pieces as the semiconductor connection substrates.

After applying electroless gold plating on the surface of the metal terminal portion and then coating solder flux on a predetermined portion with a metal mask, the external electrodes were formed by arranging the lead free solder balls having a diameter of 200 μm and performing reflow processing.

Finally, the product was separated by a dicing machine to form the electronic circuit components.

According to the present embodiment, in addition to the advantages obtained in embodiment 1, since the elements were integrated on both surfaces of the glass substrate having the through holes, the integration rate was doubled in comparison with the conventional ones in which the elements were integrated on one face of the substrate, which further reduces the size of the electronic circuit component.

Further, through the use of the glass used in embodiment 2, the electronic circuit component of course shows a high reliability such as in connection with impact resistance.

Through the use of BCB organic insulator used in embodiment 3 for the organic insulator in the present embodiment, the conductive loss and dielectric loss are reduced, thereby, an electronic circuit component having a small signal transmission loss can be obtained.

Further, by using the low dielectric loss tangent resin composition as used in embodiment 4 as the insulator layer, the conductive loss and dielectric loss are reduced, thereby, loss of signals transmitting through the electronic circuits can be reduced with the low cost material.

Further, FIG. 16 structure is one embodiment of the present invention, and the arrangement of the respective elements is not limited to that shown.

Embodiment 10

Figure 17:
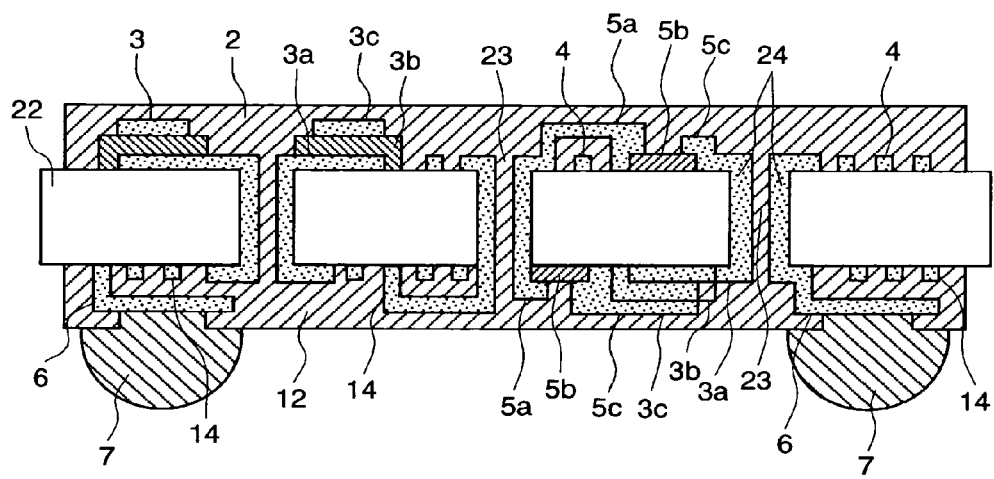
FIG. 17 is a schematic cross sectional view representing tenth embodiment of the present invention.

FIG. 17 is a cross sectional view of an electronic circuit component representing an embodiment of the present invention. In FIG. 17, 22 is a photosensitive glass substrate, 23 a through hole and 24 a conductive portion formed inside the through hole. Further, in FIG. 17, portions other than the photosensitive glass substrate 22, through hole 23 and conductive portion 24 are the same as those in embodiment 9.

Further, the manufacturing method of the electronic circuit component as shown in FIG. 17 is the same as that of embodiment 9 except for the through hole formation method which will be explained below.

For the photosensitive glass substrate a photosensitive glass series of $Li_2$—$Al_2O_3$—$SiO_2$ (Au,Ce) is used. On the main face of the photosensitive glass substrate a mask on which a through hole pattern was drawn by Cr was closely contacted and was exposed by using an Hg—Xe lamp. Thereafter, being developed and crystallized and a glass substrate having through holes were obtained.

When the photosensitive glass is used, the wall face of the through hole becomes more vertical, in other words, the taper angle thereof is enlarged in comparison with other through hole formation methods such as the sand blasting method, which permits formation of further fine through holes. Accordingly, in the present embodiment, the elements can be integrated in further high integration degree, thereby, an equivalent integration degree can be achieved with about halved area in comparison with embodiment 7 or 8.

As will be seen from the above, when the photosensitive glass substrate is used, an electronic circuit component of a high integration degree can be obtained with a low cost in addition to the advantages of embodiment 9.

Further, FIG. 17 structure is one embodiment of the present invention, and the arrangement of the respective elements is not limited to that shown.

Embodiment 11

Figure 18:
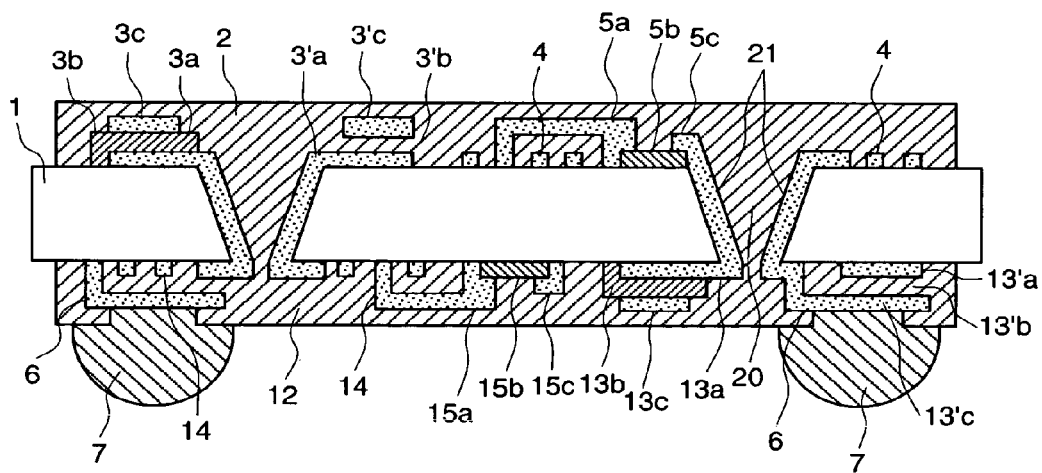
FIG. 18 is a schematic cross sectional view representing eleventh embodiment of the present invention.

FIG. 18 is a cross sectional view of a semiconductor connection substrate representing one embodiment of the present invention. In FIG. 18, 1 is a glass substrate (product of Nippon Electric Glass Co., Ltd., BLC), and the thickness of which is 0.5 mm.

In FIG. 18, 2 is an organic insulator and photosensitive polyimide (product of Hitachi Chemical Co., Ltd., HD-6000) is used therefor.

Capacitor elements formed inside the organic insulator 2 are constituted by a capacitor 3 in a three layer structure constituted by a lower electrode 3a of Cu, a dielectric body 3b of oxide of Ta and an upper electrode 3c of Cu and a capacitor 3' in a three layer structure constituted by a lower electrode 3'a of Cu, a dielectric body 3'b of polyimide and an upper electrode 3'c of Cu.

An inductor element 4 is a spiral type inductor and the material thereof is Cu.

A resistor 5 is constituted by a resistance body 5b and electrodes 5a and 5c. The resistance body 5b is a compound of Ta and Ti and the electrodes 5a and 5c are composed of Cu.

In FIG. 18, 12 is another insulator using photosensitive polyimide (product of Hitachi Chemical Co., Ltd., HD-6000).

Capacitor elements formed inside the organic insulator 12 are constituted by a capacitor 13 in a three layer structure constituted by a lower electrode 13a of Cu, a dielectric body 13b of oxide of Ta and an upper electrode 13c of Cu and a capacitor 13' in a three layer structure constituted by a lower electrode 13'a of Cu, a dielectric body 13'b of polyimide and an upper electrode 13'c of Cu.

An inductor element 14 is a spiral type inductor and the material thereof is Cu.

A resistor 15 is constituted by a resistance body 15b and electrodes 15a and 15c. The resistance body 15b is a compound of Ta and Ti and the electrodes 15a and 15c are composed of Cu.

In FIG. 18, the respective elements formed inside the organic insulators 2 and 12 are electrically connected via conductor portions filled in through holes 20 formed in the glass substrate so as to provide a predetermined functions.

In FIG. 18, 6 is a metal terminal portion used for connection with an external terminal and in the drawing a solder ball 7 is mounted on the metal terminal portion 6.

The manufacturing method of the electronic circuit component as shown in FIG. 18 will be explained.

A sand blast use film resist (product of Tokyo Ohka, Odale) of 100 μm was laminated on the glass substrate having thickness of 0.5 mm through exposure and development process and an etching use resist was formed. Subsequently, through holes were formed in the glass substrate with micro said blasting method. Then, the resist film was peeled off, electrolytic plating use seed films Cr: 50 nm, Cu: 500 nm were formed on the surface of the glass substrate and walls of the via holes with spattering method. Thereafter, on the Cu film a plating use film resist (product of Hitachi Chemical Co., Ltd., HN 920) was laminated and a resist mask was formed through exposure and development, then, conductive layers were formed inside the via holes by Cu electrolytic plating. Subsequently, the resist and the electrolytic plating seed film were peeled off.

A Cr film of 50 nm was formed on the main surface of a glass substrate spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance a covering portion of the polyimide was opened inside from the scribe area by 80 μm used for cutting into pieces as the electronic circuit components. The ployimide was hardened at 250° C./2 hours under nitrogen atmosphere to form the organic insulator of 10 μm.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

Subsequently, a Cr film of 50 nm was formed with spattering method and further, a Cu film of 500 nm was formed thereon, which was used as a seed film.

On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrode, electrodes for the resistors and the inductor element were formed.

On the plane where the upper electrode, the electrodes for the resistor and the inductor element were formed, photosensitive polyimide HD 6000 (product of Hitachi Chemical Co., Ltd.) was coated by spin coating and after prebaking with a hot plate, the same was exposed and developed. In this instance the polyimide having an opening is hardened at 250° C./1 hour under nitrogen atmosphere and the organic insulator was formed so that the polyimide covering portion comes inside by 80 μm from the scribe area used for cutting into pieces as the electronic circuit components.

A Cr film of 50 nm was formed on the back surface of the glass substrate with spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm.

Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance the polyimide having an opening is hardened at 250° C./2 hours under nitrogen atmosphere and the organic insulator of 10 μm was formed so that the polyimide covering portion comes inside by 80 μm from the scribe area used for cutting into pieces as the electronic circuit components.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrode, electrodes for the resistors and the inductor element were formed.

On the plane where the upper electrode, the electrodes for the resistor and the inductor element were formed, photosensitive polyimide HD 6000 (product of Hitachi Chemical Co., Ltd.) was coated by spin coating and after prebaking with a hot plate, through exposing and developing process the opening portion for interlayer connection was formed. In this instance the polyimide having an opening is hardened at 250° C./1 hour under nitrogen atmosphere and the organic insulator was formed so that the polyimide covering portion comes inside by 80 μm from the scribe area used for cutting into pieces as the electronic circuit components.

In order to form the metal terminal portion on the organic insulator surface the electrolytic plating use seed films Cr:50 nm, Cu:500 nm were formed. On the Cu film negative type liquid state resist PMER-N-CA1000 (product of Tokyo Ohka) was spin-coated and prebaked, thereafter, a resist mask for plating was formed through exposure and development then, a plating film of 10 μm was formed by Cu electrolytic plating and further, an electrolytic nickel plating film of 2 μm was formed. Finally, after peeling off the resist and the electrolytic plating seed film, the wirings and the metal terminal portions were formed.

On the plane where the metal terminal portions were formed, photosensitive polyimide HD 6000 (product of Hitachi Chemical Co., Ltd.) was coated by spin coating and after prebaking with a hot plate, through exposing and developing process the opening portions for forming the solder balls were formed. In this instance the polyimide having an opening is hardened at 250° C./1 hour under nitrogen atmosphere and the organic insulator was formed so that the polyimide covering portion comes inside by 80 μm from the scribe area used for cutting into pieces as the electronic circuit components.

After applying electroless gold plating on the surface of the metal terminal portion and then coating solder flux on a predetermined portion with a metal mask, the external electrodes were formed by arranging the lead free solder balls having a diameter of 200 μm and performing reflow processing.

Finally, the product was separated by a dicing machine to form the electronic circuit components.

In the present embodiment, through the use of the inorganic material having a high dielectric constant such as the oxide of Ta as well as the organic material having a low dielectric constant such as the polyimide as the dielectric body material, capacitors having a small capacitance can be formed accurately, which enhances reliability of the circuits and expands available capacitance range. Further, through the use of the same material for the dielectric body as the insulator material, which covers the circumference of the elements, the electronic circuit component can be manufactured in further simplified and low cost processes in addition to the advantages obtained in embodiment 9.

Further, through the use of the glass used in embodiment 2, the electronic circuit component of course shows a high reliability such as in connection with impact resistance.

Further, through the use of the photosensitive glass substrate as used in embodiment 10 a low cost electronic circuit component having further high integration degree can be of course obtained.

Through the use of BCB organic insulator used in embodiment 3 for the organic insulator in the present embodiment, the conductive loss and dielectric loss are reduced, thereby, an electronic circuit component having a small signal transmission loss can be obtained.

Further, by using the low dielectric loss tangent resin composition as used in embodiment 4 as the insulator layer, the conductive loss and dielectric loss are reduced, thereby, loss of signals transmitting through the electronic circuits can be reduced with the low cost material.

Further, FIG. 18 structure is one embodiment of the present invention, and the arrangement of the respective elements is not limited to that shown.

Embodiment 12

Figure 19:
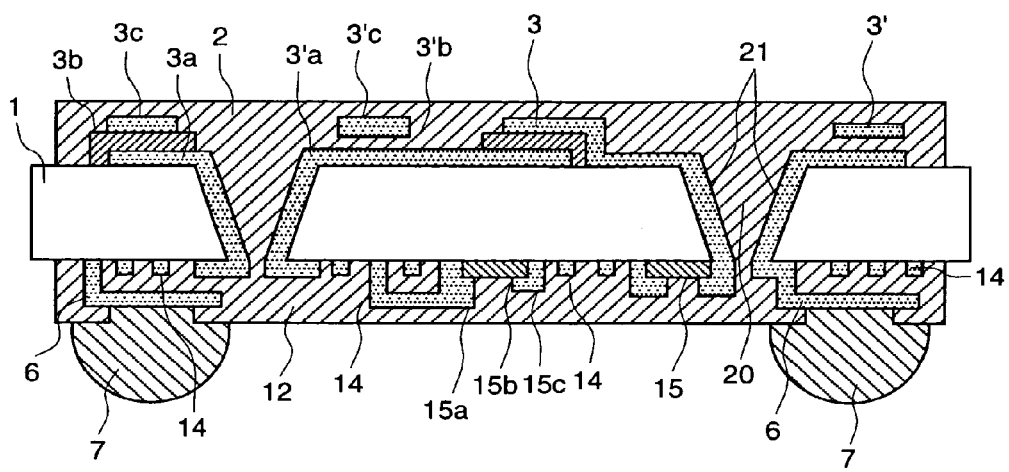
FIG. 19 is a schematic cross sectional view representing twelfth embodiment of the present invention.

FIG. 19 is a cross sectional view of a semiconductor connection substrate representing one embodiment of the present invention. In FIG. 19, 1 is a glass substrate (product of Nippon Electric Glass Co., Ltd., BLC), and the thickness of which is 0.5 mm.

In FIG. 19, 2 is an organic insulator and photosensitive polyimide (product of Hitachi Chemical Co., Ltd., HD-6000) is used therefor.

Capacitor elements formed inside the organic insulator 2 are constituted by a capacitor 3 in a three layer structure constituted by a lower electrode 3a of Cu, a dielectric body 3b of oxide of Ta and an upper electrode 3c of Cu and a capacitor 3' in a three layer structure constituted by a lower electrode 3'a of Cu, a dielectric body 3'b of polyimide and an upper electrode 3'c of Cu.

In FIG. 19, 12 is another insulator using photosensitive polyimide (product of Hitachi Chemical Co., Ltd., HD-6000).

An inductor element 14 is a spiral type inductor and the material thereof is Cu.

A resistor 15 is constituted by a resistance body 15b and electrodes 15a and 15c. The resistance body 15b is a compound of Ta and Ti and the electrodes 15a and 15c are composed of Cu.

In FIG. 19, the respective elements formed inside the organic insulators 2 and 12 are electrically connected via conductor portions filled in through holes 20 formed in the glass substrate so as to provide a predetermined functions.

In FIG. 19, 6 is a metal terminal portion used for connection with an external terminal and in the drawing a solder ball 7 is mounted on the metal terminal portion 6.

The manufacturing method of the electronic circuit component as shown in FIG. 19 will be explained.

A sand blast use film resist (product of Tokyo Ohka, Odale) of 100 μm was laminated on the glass substrate having thickness of 0.5 mm through exposure and development process and an etching use resist was formed. Subsequently, through holes were formed in the glass substrate with micro sand blasting method. Then, the resist film was peeled off, electrolytic plating use seed films Cr:50 nm, Cu:500 nm were formed on the surface of the glass substrate and walls of the via holes with spattering method. Thereafter, on the Cu film a plating use film resist (product of Hitachi Chemical Co., Ltd., HN 920) was laminated and a resist mask was formed through exposure and development, then, conductive layers were formed inside the via holes by Cu electrolytic plating. Subsequently, the resist and the electrolytic plating seed film were peeled off.

A Cr film of 50 nm was formed on the main surface of a glass substrate spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance a covering portion of the polyimide was opened inside from the scribe area by 80 μm used for cutting into pieces as the electronic circuit components. The ployimide was hardened at 250° C./2 hours under nitrogen atmosphere to form the organic insulator of 10 m.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrodes were formed.

On the plane where the upper electrodes were formed, photosensitive polyimide HD 6000 (product of Hitachi Chemical Co., Ltd.) was coated by spin coating and after prebaking with a hot plate, the same was exposed and developed. In this instance the polyimide having an opening is hardened at 250° C./1 hour under nitrogen atmosphere and the organic insulator was formed so that the polyimide covering portion comes inside by 80 μm from the scribe area used for cutting into pieces as the electronic circuit components.

Then, on the back face of the glass substrate a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the electrodes for the resistors and the inductor element were formed.

On the plane where the electrodes for the resistor and the inductor element were formed, photosensitive polyimide HD 6000 (product of Hitachi Chemical Co., Ltd.) was coated by spin coating and after prebaking with a hot plate, through exposing and developing process the opening portion for interlayer connection was formed. In this instance the polyimide having an opening is hardened at 250° C./1 hour under nitrogen atmosphere and the organic insulator was formed so that the polyimide covering portion comes inside by 80 μm from the scribe area used for cutting into pieces as the electronic circuit components.

In order to form the metal terminal portion on the organic insulator surface the electrolytic plating use seed films Cr:50 nm, Cu:500 nm were formed. On the Cu film negative type liquid state resist PMER-N-CA1000 (product of Tokyo Ohka) was spin-coated and prebaked, thereafter, a resist mask for plating was formed through exposure and development then, a plating film of 10 μm was formed by Cu electrolytic plating and further, an electrolytic nickel plating film of 2 μm was formed. Finally, after peeling off the resist and the electrolytic plating seed film, the wirings and the metal terminal portions were formed.

On the plane where the metal terminal portions were formed, photosensitive polyimide HD 6000 (product of Hitachi Chemical Co., Ltd.) was coated by spin coating and after prebaking with a hot plate, through exposing and developing process the opening portions for forming the solder balls were formed. In this instance the polyimide having an opening is hardened at 250° C./1 hour and the organic insulator was formed so that the polyimide covering portion comes inside by 80 μm from the scribe area used for cutting into pieces as the electronic circuit components.

After applying electroless gold plating on the surface of the metal terminal portion and then coating solder flux on a predetermined portion with a metal mask, the external electrodes were formed by arranging the lead free solder balls having a diameter of 200 μm and performing reflow processing.

Finally, the product was separated by a dicing machine to form the electronic circuit components.

In the present embodiment, as will be apparent from the above, since the respective elements are arranged on different faces, a possible influence of coupling between the respective elements can be reduced, thereby, the parasitic capacitance can be suppressed small and self oscillation frequencies of the respective elements can be increased, thus, in addition to the advantages obtained in embodiments 9 and 11 a high performance electronic circuit component can be obtained.

Further, through the use of the glass used in embodiment 2, the electronic circuit component of course shows a high reliability such as in connection with impact resistance.

Further, through the use of the photosensitive glass substrate as used in embodiment 10 a low cost electronic circuit component having further high integration degree can be of course obtained.

Through the use of BCB organic insulator used in embodiment 3 for the organic insulator in the present embodiment, the conductive loss and dielectric loss are reduced, thereby, an electronic circuit component having a small signal transmission loss can be obtained.

Further, by using the low dielectric loss tangent resin composition as used in embodiment 4 as the insulator layer, the conductive loss and dielectric loss are reduced, thereby, loss of signals transmitting through the electronic circuits can be reduced with the low cost material.

Further, FIG. 19 structure is one embodiment of the present invention, and the arrangement of the respective elements is not limited to that shown.

Embodiment 13

Figure 20:
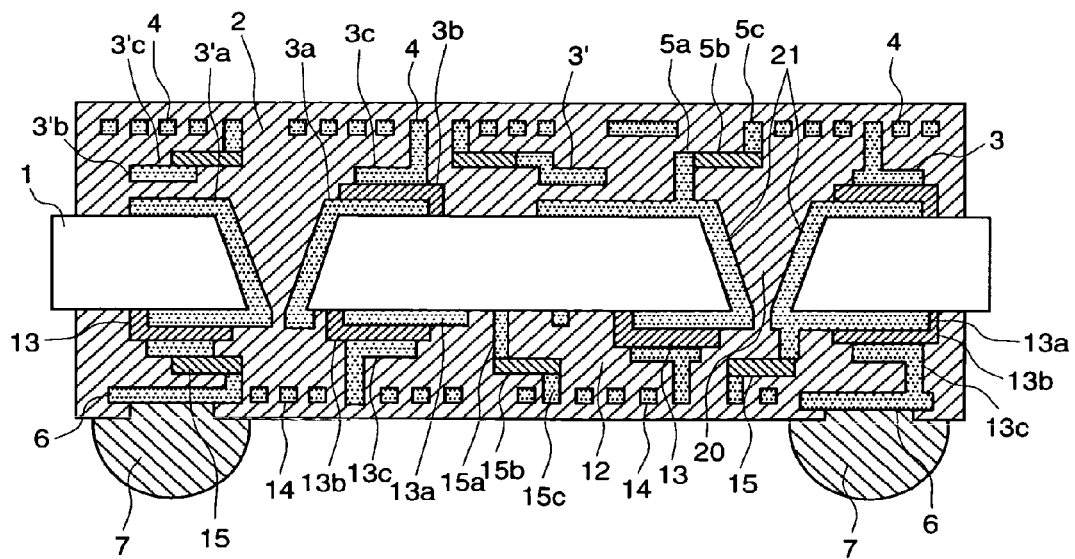
FIG. 20 is a schematic cross sectional view representing thirteenth embodiment of the present invention.

FIG. 20 is a cross sectional view of an electronic circuit component representing one embodiment of the present invention. In FIG. 20, 1 is a glass substrate (product of Nippon Electric Glass Co., Ltd., BLC), and the thickness of which is 0.5 mm.

In FIG. 20, 2 is an organic insulator and photosensitive polyimide (product of Hitachi Chemical Co., Ltd., HD-6000) is used therefor.

Capacitor elements formed inside the organic insulator 2 are constituted by a capacitor 3 in a three layer structure constituted by a lower electrode 3a of Cu, a dielectric body 3b of oxide of Ta and an upper electrode 3c of Cu and a capacitor 3' in a three layer structure constituted by a lower electrode 3'a of Cu, a dielectric body 3'b of polyimide and an upper electrode 3'c of Cu.

An inductor element 4 is a spiral type inductor and the material thereof is Cu.

A resistor 5 is constituted by a resistance body 5b and electrodes 5a and 5c. The resistance body 5b is a compound of Ta and Ti and the electrodes 5a and 5c are composed of Cu.

In FIG. 20, 12 is another insulator using photosensitive polyimide (product of Hitachi Chemical Co., Ltd., HD-6000).

Capacitor elements formed inside the organic insulator 12 are constituted by a capacitor 13 in a three layer structure constituted by a lower electrode 13a of Cu, a dielectric body 13b of oxide of Ta and an upper electrode 13c of Cu and a capacitor 13' in a three layer structure constituted by a lower electrode 13'a of Cu, a dielectric body 13'b of polyimide and an upper electrode 13'c of Cu.

An inductor element 14 is a spiral type inductor and the material thereof is Cu.

A resistor 15 is constituted by a resistance body 15b and electrodes 15a and 15c. The resistance body 15b is a compound of Ta and Ti and the electrodes 15a and 15c are composed of Cu.

In FIG. 20, the respective elements formed inside the organic insulators 2 and 12 are electrically connected via conductor portions filled in through holes 20 formed in the glass substrate so as to provide a predetermined functions.

In FIG. 20, 6 is a metal terminal portion used for connection with a n external terminal and in the drawing a solder ball 7 is mounted on the metal terminal portion 6.

The manufacturing method of the electronic circuit component as shown in FIG. 20 will be explained.

A sand blast use film resist (product of Tokyo Ohka, Odale) of 100 μm was laminated on the glass substrate having thickness of 0.5 mm through exposure and development process and an etching use resist was formed. Subsequently, through holes were formed in the glass substrate with micro sand blasting method. Then, the resist film was peeled off, electrolytic plating use seed films Cr: 50 nm, Cu: 500 nm were formed on the surface of the glass substrate and walls of the via-holes with spattering method. Thereafter, on the Cu film a plating use film resist (product of Hitachi Chemical Co., Ltd., HN 920) was laminated and a resist mask was formed through exposure and development, then, conductive layers were formed inside the via holes by Cu electrolytic plating. Subsequently, the resist and the electrolytic plating seed film were peeled off.

A Cr film of 50 nm was formed on the main surface of a glass substrate spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance, the polyimide layer was opened so that the end portion of the opening was located at the inner side from the end of the lower electrode by 20 μm. The polyimide is hardened at 250° C./2 hours under nitrogen atmosphere to form the organic insulator of 10 μm.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 1 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrodes were formed.

On the plane where the upper electrodes were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

A Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the electrodes for the resistors were formed.

On the plane where the electrodes for the resistor were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the inductor elements were formed.

On the plane where the inductor elements were formed, photosensitive polyimide HD 6000 (product of Hitachi Chemical Co., Ltd.) was coated by spin coating and after prebaking with a hot plate, through exposing and developing process of the same the polyimide was hardened at 250° C./1 hour to form the organic insulator.

A Cr film of 50 nm was formed on the back surface of a glass substrate spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance, the polyimide layer was opened so that the end portion of the opening was located at the inner side from the end of the lower electrode by 20 μm. The polyimide is hardened at 250° C./2 hours under nitrogen atmosphere to form the organic insulator of 10 μm.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrodes were formed.

On the plane where the upper electrodes were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

A Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the electrodes for the resistors were formed.

On the plane where the electrodes for the resistor were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series, Cr seed film was removed and the inductor elements, the wirings and the metal terminal portions were formed.

On the plane where the inductor elements, the wirings and the metal terminal portions were formed, photosensitive polyimide HD 6000 (product of Hitachi Chemical Co., Ltd.) was coated by spin coating and after prebaking with a hot plate, through exposing and developing process the opening portions for forming the solder balls were formed and the polyimide was hardened at 250° C./1 hour to form the organic insulator.

After applying electroless gold plating on the surface of the metal terminal portion and then coating solder flux on a predetermined portion with a metal mask, the external electrodes were formed by arranging the lead free solder balls having a diameter of 200 μm and performing reflow processing.

Finally, the product was separated by a dicing machine to form the electronic circuit components.

In the present embodiment, since the capacitor elements, inductor elements and resistor elements are respectively arranged at a plurality of different distances from the surface of the glass substrate, the respective elements can be integrated in further high density, therefore, a further small sized electronic circuit component can be obtained in addition to the advantages obtained in embodiments 9 and 11.

Further, through the use of the glass used in embodiment 2, the electronic circuit component of course shows a high reliability such as in connection with impact resistance.

Further, through the use of the photosensitive glass substrate as used in embodiment 10 a low cost electronic circuit component having further high integration degree can be of course obtained.

Through the use of BCB organic insulator used in embodiment 3 for the organic insulator in the present embodiment, the conductive loss and dielectric loss are reduced, thereby, an electronic circuit component having a small signal transmission loss can be obtained.

Further, by using the low dielectric loss tangent resin composition as used in embodiment 4 as the insulator layer, the conductive loss and dielectric loss are reduced, thereby, loss of signals transmitting through the electronic circuits can be reduced with the low cost material.

Further, FIG. 20 structure is one embodiment of the present invention, and the arrangement of the respective elements is not limited to that shown.

Embodiment 14

Figure 21:
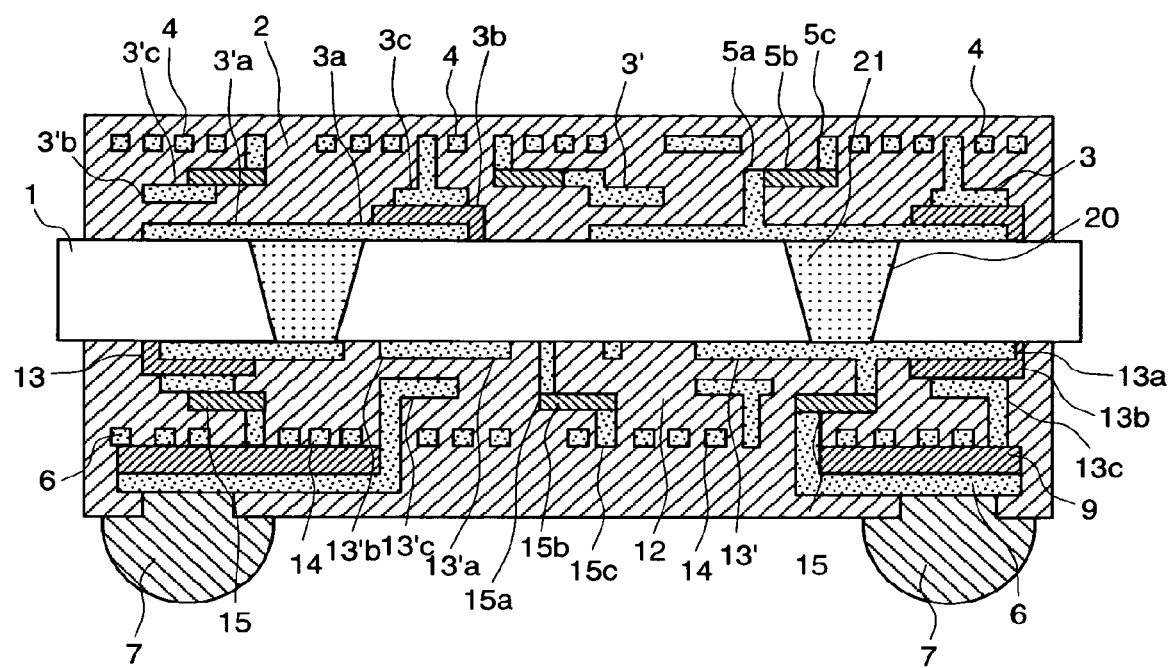
FIG. 21 is a schematic cross sectional view representing fourteenth embodiment of the present invention.

FIG. 21 is a cross sectional view of an electronic circuit component representing one embodiment of the present invention. In FIG. 21, 1 is a glass substrate (product of Nippon Electric Glass Co., Ltd., BLC), and the thickness of which is 0.5 mm.

In FIG. 21, 2 and 12 are an organic insulator and photosensitive polyimide (product of Hitachi Chemical Co., Ltd., HD-6000) is used therefor.

Capacitor elements formed inside the organic insulators 2 and 12 are constituted by capacitors 3 and 13 in a three layer structure constituted by lower electrodes 3a and 13a of Cu, a dielectric bodies 3b and 13b of oxide of Ta and upper electrodes 3c and 13c of Cu and capacitors 3' and 13' in a three layer structure constituted by lower electrode 3'a 13'a of Cu, dielectric bodies 3'b and 13'b of polyimide and upper electrode 3'c and 13'c of Cu. Further, on the upper electrode connecting portions 8 for connecting with upper wirings are provided An inductor element 4 and 14 are spiral type inductors and the material thereof is Cu.

Resistors 5 and 15 are constituted by resistance bodies 5b and 15 and electrodes 5a 15a and 5c and 15c. The resistance bodies 5b and 15b are a compound of Ta and Ti and the electrodes 5a and 15a and 5c and 15c are composed of Cu.

In FIG. 21, the respective elements formed inside the organic insulators 2 and 12 are electrically connected via conductor portions filled in through holes 20 formed in the glass substrate so as to provide a predetermined functions.

In the semiconductor connection substrate as shown in FIG. 21, an organic insulator 9 having a function of buffering stress is provided. For the organic insulator having the stress buffering function, a liquid polyimide material in which polyimide fine particles are dispersed (product of Hitachi Chemical Co., Ltd., GH-P500) was used.

In FIG. 21, 6 is a metal terminal portion used for connection with an external terminal and in the drawing a solder ball 7 is mounted on the metal terminal portion 6.

The manufacturing method of the electronic circuit component as shown in FIG. 21 will be explained.

A sand blast use film resist (product of Tokyo Ohka, Odale) of 100 μm was laminated on the glass substrate having thickness of 0.5 mm through exposure and development process and an etching use resist was formed. Subsequently, through holes were formed in the glass substrate with micro sand blasting method. Then, the resist film was peeled off, electrolytic plating use seed films Cr: 50 nm, Cu: 500 nm were formed on the surface of the glass substrate and walls of the via holes with spattering method. Thereafter, on the Cu film a plating use film resist (product of Hitachi Chemical Co., Ltd., HN 920) was laminated and a resist mask was formed through exposure and development, then, conductive layers were formed inside the via holes by Cu electrolytic plating. Subsequently, the resist and the electrolytic plating seed film were peeled off.

A Cr film of 50 nm was formed on the main surface of a glass substrate spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide, HD 6000 (product of Hitachi Chemical Co., Ltd.) was coated by spin coating and after prebaking with a hot plate, through exposing and developing process the dielectric layer over the lower electrode was exposed. In this instance, the polyimide layer was opened so that the end portion of the opening was located at the inner side from the end of the lower electrode by 20 μm. The polyimide is hardened at 250° C./2 hours under nitrogen atmosphere to form the organic insulator of 10 μm.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrodes were formed.

On the plane where the upper electrodes were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

A Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 m was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the electrodes for the resistors were formed.

On the plane where the electrodes for the resistor were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the inductor elements were formed.

On the plane where the inductor elements were formed, photosensitive polyimide HD 6000 (product of Hitachi Chemical Co., Ltd.) was coated by spin coating and after prebaking with a hot plate, through exposing and developing process the same, the polyimide was hardened at 250° C./1 hour to form the organic insulator.

A Cr film of 50 nm was formed on the back surface of a glass substrate spattering method and further, a Cu film of 500 nm was formed thereon, which was used for current feeding use seed film for Cu plating. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the lower electrode was formed.

Subsequently, as a barrier film, a Cr film of 50 nm is formed with spattering method.

Then, $Ta_2O_5$ film having thickness of 500 nm was formed on the lower electrode by spattering method. On the $Ta_2O_5$ film positive type liquid resist OFPR800, 500 cp (product of Tokyo Ohka) was coated and after performing drying, exposing and developing process a resist mask for a dielectric layer was formed. Subsequently, dry etch was performed by making use of $CF_4$ to remove unnecessary portion thereof and further, unnecessary portion of the barrier layer was removed with Cr etching liquid of permanganic acid, then, the resist mask was removed and the dielectric layer was formed.

Subsequently, photosensitive polyimide HD 6000 (product of Hitachi Chemical Co., Ltd.) was coated by spin coating and after prebaking with a hot plate, through exposing and developing process the dielectric layer over the lower electrode was exposed. In this instance, the polyimide layer was opened so that the end portion of the opening was located at the inner side from the end of the lower electrode by 20 μm. The polyimide is hardened at 250° C./2 hours under nitrogen atmosphere to form the organic insulator of 10 μm.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 1 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the upper electrodes were formed.

On the plane where the upper electrodes were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Then, a TaN film of 500 nm was formed with spattering method. On the film positive type liquid state resist OFPR 800, 100 cp was spin-coated and prebaked, thereafter, a resist pattern mask was formed through exposure and development. By using the mask The TaN film was dry etched with $CF_4$. Then, a plurality of resistor elements were formed by peeling off the resist.

A Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the electrodes for the resistors were formed.

On the plane where the electrodes for the resistor were formed, photosensitive polyimide HD 6000 (product of Hitachi Chemical Co., Ltd.) was coated by spin coating and after prebaking with a hot plate, through exposing and developing process the opening portion for interlayer connection was formed and the polyimide was hardened at 250° C./1 hour to form the organic insulator.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the inductor elements and the wirings were formed.

Thereafter, the liquid polyimide material GH-P 500 in which polyimide fine particles are dispersed (product of Hitachi Chemical Co., Ltd.) was print coated by using a mask, heated on a hot plate at 200° C./25 min and hardened in a constant temperature bath at 250° C./60 min to form the organic insulator having stress buffering function.

Subsequently, a Cr film of 50 nm was formed with spattering method and further, a Cu film of 500 nm was formed thereon, which was used as a seed film. On the Cu film negative type liquid state resist PMER-N-CA1000 (product of Tokyo Ohka) was spin-coated, after prebaking the same with a hot plate, a resist mask was formed through exposure and development steps. At the resist opening portions electrolytic copper plating of 10 μm was performed with current density of 1 A/dm. Subsequently, the resist mask was removed and the copper seed film was removed with copper etching liquid Cobra etch (product of Ebara Densan). Further, by making use of Cr etching liquid of permanganic acid series Cr seed film was removed and the wirings and the metal terminal portions were formed.

On the plane where the wirings and the metal terminal portions were formed, photosensitive polyimide HD 6000 (product of Hitachi Chemical Co., Ltd.) was coated by spin coating and after prebaking with a hot plate, through exposing and developing process the opening portions for forming the solder balls were formed and the polyimide was hardened at 250° C./1 hour to form the organic insulator.

After applying electroless gold plating on the surface of the metal terminal portion and then coating solder flux on a predetermined portion with a metal mask, the external electrodes were formed by arranging the lead free solder balls having a diameter of 200 μm and performing reflow processing.

Finally, the product was separated by a dicing machine to form the electronic circuit components.

In the present embodiment, since the organic insulator having stress buffering function is formed immediately below the metal terminal portion 6, when being connected to a mounting substrate such as a print substrate, a thermal stress applied to the metal terminal portion 6 and the solder ball 7 due to difference of thermal expansion coefficients between the semiconductor connection substrate and the mounting substrate can be relaxed. Thereby, a semiconductor connection substrate having excellent heart resistance cycle can be obtained in addition to the advantages obtained in embodiment 13.

Further, through the use of the glass used in embodiment 2, the electronic circuit component of course shows a high reliability such as in connection with impact resistance.

Further, through the use of the photosensitive glass substrate as used in embodiment 10 a low cost electronic circuit component having further high integration degree can be of course obtained.

Through the use of BCB organic insulator used in embodiment 3 for the organic insulator in the present embodiment, the conductive loss and dielectric loss are reduced, thereby, an electronic circuit component having a small signal transmission loss can be obtained.

Further, by using the low dielectric loss tangent resin composition as used in embodiment 4 as the insulator layer, the conductive loss and dielectric loss are reduced, thereby, loss of signals transmitting through the electronic circuits can be reduced with the low cost material.

Further, FIG. 21 structure is one embodiment of the present invention, and the arrangement of the respective elements is not limited to that shown.

In the followings, other embodiments of the present invention will be explained.

Through provision of (1) a glass substrate, (2) one or a plurality of elements selected from a capacitor element, an inductor element and resistor element each provided on the glass substrate, (3) a metal wiring provided on the glass substrate for connecting the elements, (4) a metal terminal portion which is a part of the metal wiring provided on the glass substrate and (5) an organic insulator which covers the elements and the circumference of the metal wiring portion except for the metal terminal portion, an electronic circuit component which permits to integrate a variety of electronic parts such as a capacitor, inductor and resistor in a high performance and in a high density can be obtained.

Through provision of (1) a glass substrate at predetermined positions of which through holes are provided, (2) one or a plurality of elements selected from a capacitor element, inductor element and resistor element each provided on one or both sides of the glass substrate, (3) a metal wiring provided on both sides of the glass substrate for connecting the elements, (4) conductive portions formed inside the through holes for electrically connecting the metal wiring, (5) a metal terminal portion which is a part of the metal wiring provided on one or both of the glass substrate and (6) an organic insulator which covers the elements and the circumference of the metal wiring portion except for the metal terminal portion, a n electronic circuit component which permits to integrate a variety of electronic parts such as a capacitor, inductor and resistor in a high performance and in a high density can be obtained.

By forming one or the plurality of elements selected from the capacitor elements, inductor elements and resistor elements, the metal wiring, the metal terminal portion and the organic insulator at the inside from the end portion of the glass substrate, the structural portions where stresses concentratedly applied at the time of cutting out the electronic circuit component and at the time of mounting the same are designed to withstand the stresses and a possible damage on the electronic circuit component due to the applied stresses can be greatly reduced, thereby, a highly reliable electronic circuit component of a desirable manufacturing yield which permits to integrate a variety of electronic parts such as a capacitor, inductor and resistor in a high performance and in a high density can be obtained.

Since the capacitor elements are constituted by one or more of capacitor elements having a structure in which an inorganic dielectric material is sandwiched by two metal electrodes and one or more capacitor elements having a structure in which an organic dielectric material is sandwiched by two electrodes, through a proper use of dielectric materials of organic or inorganic or both, a small sized electronic circuit component of a high performance and a high integration degree can be obtained.

Since the inorganic dielectric material is an oxide of any of Ta, Mg and Sr and the organic dielectric material is polyimide, a highly reliable and high performance electronic circuit component of low cost can be obtained because of low cost and high stability property of Ta, Mg and Sr and of high thermal stability of polyimide.

Since the inorganic dielectric material is an oxide of any of Ta, Mg and Sr and the organic dielectric material is BCB (Benzo Cyclo Butene), a highly reliable and high performance electronic circuit component of low cost can be obtained because of low cost and high stability property of Ta, Mg and Sr and of low dielectric constant and dielectric loss tangent of BCB.

Since the inorganic dielectric material is an oxide of any of Ta, Mg and Sr and the organic dielectric material is a low dielectric loss tangent resin composition which includes a bridging component having a plurality of styrene groups as expressed by the above referred to general chemical formula and contains polymers having average molecular weight of more than 5000, a highly reliable and high performance electronic circuit component of low cost can be obtained because of low cost and high stability property of Ta, Mg and Sr and of low dielectric constant and dielectric loss tangent of the low dielectric loss tangent resin composition of low cost.

Since the end portion of the metal electrode of the capacitor element at the side of the glass substrate is covered by an insulator other than the dielectric insulator, a short circuiting between the electrodes and reduction of dielectric strength are prevented and a highly reliable capacitor element with a low defective rate can be provided without reducing design freedom, thus, a low defective rate and highly reliable electronic circuit component having a plurality of built-in capacitor elements can be obtained.

Through the use of the electronic circuit component a high performance, highly reliable and small sized wireless terminal device of low cost can be obtained.

Through the use of the electronic circuit component a high performance, highly reliable and small sized wireless base station device of low cost can be obtained.

Through the use of the electronic circuit component a high performance, highly reliable and small sized wireless measurement device of low cost can be obtained.

Since the following relationship between the two opening diameters R1 and R2 (R≧R2) of the through holes and the thickness t of the glass substrate is satisfied;

$$70 \leq \tan^{-1}(t/(R1-R2)) \leq 80$$

a further small size electronic circuit component can be obtained, because the circuits are integrated in a further high density.

Since any of the capacitor elements, inductor elements and resistor elements are arranged on one face of the glass substrate and the remaining elements are arranged on the other face of the substrate, a possible influence between the respective elements can be reduced and the self oscillation frequencies of the elements can be increased because of reduced parasitic capacitance.

With the above embodiments, the structural portions where stresses concentratedly applied at the time of cutting out the electronic circuit component and at the time of mounting the same are designed to withstand the stresses and a possible damage on the electronic circuit component due to the applied stresses can be greatly reduced, and thereby, a highly reliable electronic circuit component of a desirable manufacturing yield which permits to integrate a variety of electronic parts such as a capacitor, inductor and resistor in a high performance and in a high density can be obtained.

The invention claimed is:

1. An electronic circuit component comprising:
    an insulator substrate having at least one through hole at a predetermined position therein;
    a capacitor comprising a plurality of electrodes having different areas provided on the insulator substrate and dielectric material sandwiched between the electrodes;
    at least one element selected from the group consisting of an inductor element and a resistor element;
    a metal wiring connecting the elements;
    a metal terminal part of a part of the metal wiring; and
    an organic insulator material covering the elements and the circumference of the metal wiring portion, excluding the metal terminal portion; wherein,
    the area of an upper electrode of said capacitor is smaller than the area of a lower electrode of said capacitor;
    said upper electrode is connected to the metal wiring by a lead-out wiring via the at least one through hole, through the organic insulator material; and
    the lead-out wiring does not contact the dielectric material.

2. An electronic circuit component according to claim 1, wherein the insulator substrate is a glass substrate.

3. An electronic circuit component according to claim 1, wherein the organic insulator material is a photosensitive organic insulator material.

4. An electronic circuit component according to claim 1, wherein the organic insulator material is a low dielectric loss tangent resin composition which includes a bridging component having a plurality of styrene groups as expressed by the following general chemical formula and contains polymers having average molecular weight of more than 5000,

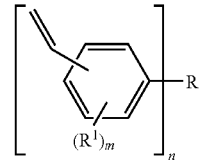

(Wherein, R represents a hydrocarbon skeleton, which may include a substituent, R1 represents one of hydrogen, methyl and ethyl, m represents 1 from 4 and n represents an integer more than 1).

5. An electronic circuit component according to claim 1, wherein the organic insulator material is polyimide.

6. An electronic circuit component according to claim 1, wherein the organic insulator material is BCB (Benzo Cyclo Butene).

7. An electronic circuit component according to claim 1, wherein the dielectric material is an organic insulator material or an oxide of any one of Ta, Mg and Sr.

* * * * *